United States Patent
Sugiyama

(10) Patent No.: US 8,404,556 B2
(45) Date of Patent: Mar. 26, 2013

(54) METHOD FOR MANUFACTURING SEMICONDUCTOR DEVICE

(75) Inventor: Yuya Sugiyama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/170,891

(22) Filed: Jun. 28, 2011

(65) Prior Publication Data

US 2012/0077326 A1    Mar. 29, 2012

(30) Foreign Application Priority Data

Sep. 28, 2010   (JP) ................. 2010-217292

(51) Int. Cl.
*H01L 21/20* (2006.01)
(52) U.S. Cl. ........... 438/396; 438/3; 257/E21.664
(58) Field of Classification Search ........... 257/E21.015, 257/E21.017, E21.02
See application file for complete search history.

(56) References Cited

U.S. PATENT DOCUMENTS

| 6,194,228 B1 * | 2/2001 | Fujiki et al. ............. 438/3 |
| 6,555,864 B1 | 4/2003 | Cross et al. |
| 2002/0190293 A1 | 12/2002 | Cross et al. |
| 2009/0020797 A1 * | 1/2009 | Wang ............. 257/295 |

FOREIGN PATENT DOCUMENTS

| JP | 2000-252444 A | 9/2000 |
| JP | 2000-260954 A | 9/2000 |

* cited by examiner

*Primary Examiner* — Cheung Lee
(74) *Attorney, Agent, or Firm* — Westerman, Hattori, Daniels & Adrian, LLP

(57) ABSTRACT

In forming a ferro-electric capacitor structure of an FeRAM, a lower electrode film is formed (step S1), a first ferro-electric film is formed (step S2), the first ferro-electric film is crystallized by a first heat treatment (step S3), a second ferro-electric film in an amorphous state is formed on the first ferro-electric film (step S4), an SRO film in an amorphous state is formed on the second ferro-electric film (step S5), a first upper electrode film is formed on the SRO film (step S6), and the second ferro-electric film and the SRO film are crystallized by a second heat treatment (step S7).

8 Claims, 21 Drawing Sheets

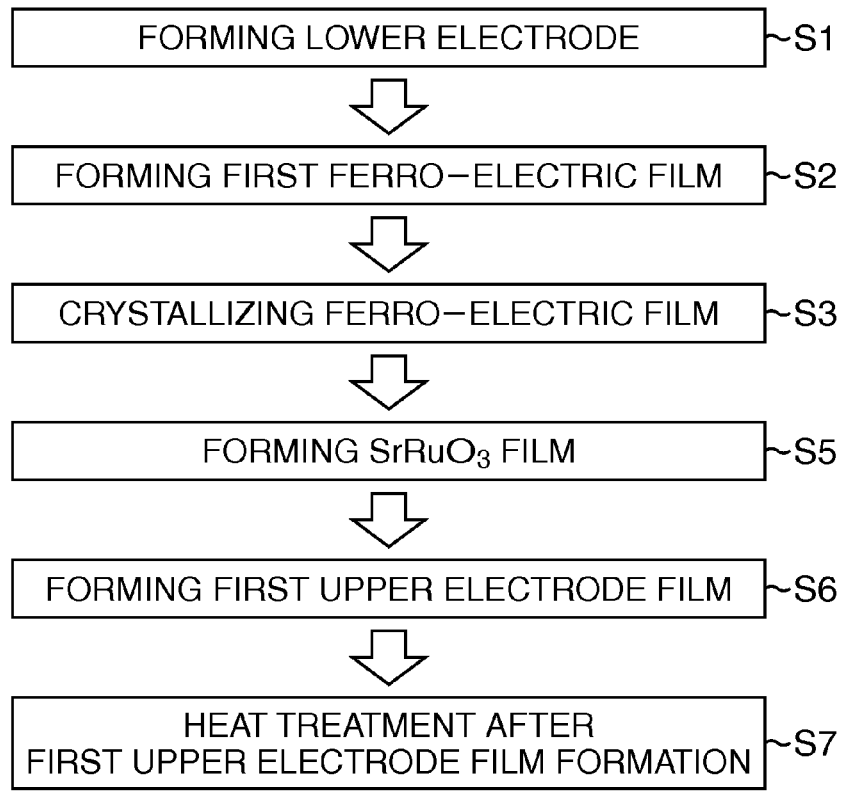
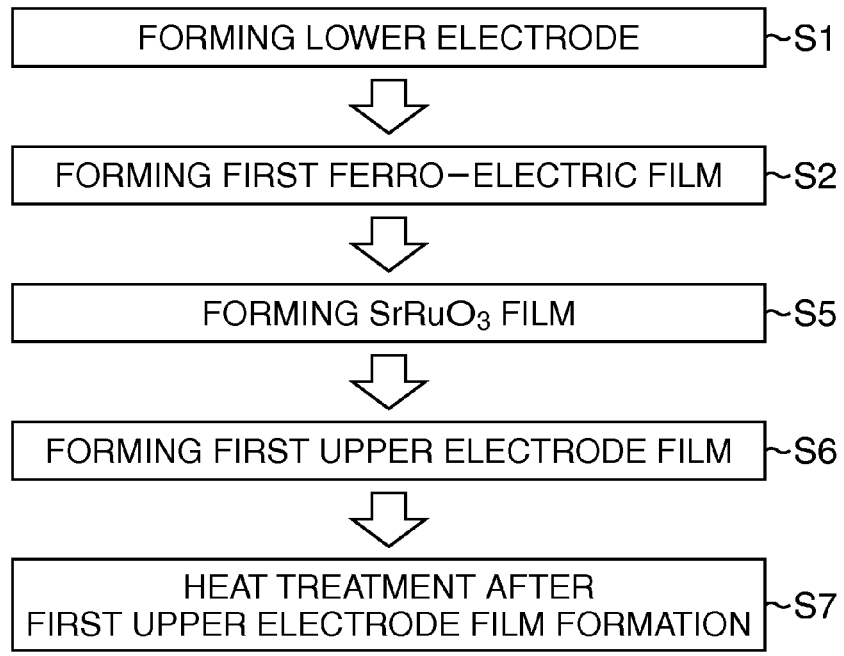

FIRST HEAT TREATMENT

METHOD FOR MANUFACTURING SEMICONDUCTOR DEVICE

CROSS-REFERENCE TO RELATED APPLICATION

This application is based upon and claims the benefit of priority of the prior Japanese Patent Application No. 2010-217292, filed on Sep. 28, 2010, the entire contents of which are incorporated herein by reference.

FIELD

The embodiments discussed herein are directed to a semiconductor device having a capacitor structure in which a capacitor film made of a dielectric material is sandwiched between a lower electrode and an upper electrode, and is preferable to be applied in particular to a ferro-electric capacitor structure whose capacitor film is made of a ferro-electric material.

BACKGROUND

In recent years, a ferro-electric memory (FeRAM: Ferro-electric Random Access Memory) is being developed in which information is held in a ferro-electric capacitor structure by using polarization inversion of a ferro-electric. The ferro-electric memory is a nonvolatile memory in which held information is not lost even when a power supply is off, and attracts attention in particular since realization of a high integration degree, a high-speed drive, a high durability, and a low power consumption can be expected.

Recently, there is an increasing request for a low voltage operation of a ferro-electric memory. In order to achieve the low voltage operation, it is necessary to thin a ferro-electric film being a capacitor film of a ferro-electric capacitor.

However, there is a problem that thinning of the ferro-electric film leads to a decrease of a polarization inversion amount and an increase of a leak current.

As a cause of the decrease of the polarization inversion amount, it can be thought that due to thinning of the ferro-electric film lattice matching of an interface between the ferro-electric film and an upper electrode affects an electric property. If the lattice matching is not good, a high polarization inversion amount cannot be obtained.

Further, it can be thought that a cause of the increase of the leak current similarly depends on a state of the interface between the ferro-electric film and the upper electrode. When the ferro-electric film is crystallized by a heat treatment, a grain boundary is formed on that interface, and on that occasion a space occurrs in the grain boundary. If a material of the upper electrode is filled into this space portion, an effective film thickness of the ferro-electric film becomes thin, leading to the increase of the leak current.

Japanese Laid-open Patent Publication No. 2000-260954 and Japanese Laid-open Patent Publication No. 2000-252444 disclose configurations in which a composition of Pb, Zr, Ti of a capacitor film made of PZT is adjusted by using an $SrRuO_3$ (SRO) film for a part or an entire of an upper electrode. However, in such a case, a leak current increases compared with a case in which an SRO film is not used.

SUMMARY

According to an aspect of the embodiment, a method for manufacturing a semiconductor device includes: forming a first electrode film to be a lower electrode in the above of a semiconductor substrate; forming a first dielectric film on the first electrode film; performing a first heat treatment to the semiconductor substrate; forming a second dielectric film on the first dielectric film; forming an $SrRuO_3$ film on the second dielectric film; forming a second electrode film to be at least a part of the upper electrode on the $SrRuO_3$ film; and performing a second heat treatment to the semiconductor substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 is a flowchart illustrating main process steps in a method for manufacturing an FeRAM according to a comparative example 2;

FIG. 12 is a flowchart illustrating main process steps in a method for manufacturing an FeRAM according to a comparative example 3;

DESCRIPTION OF EMBODIMENTS

Concrete embodiments will be explained in detail with reference to accompanying drawings. In the following embodiments, cases in which the embodiment is applied to an FeRAM are exemplified, but the embodiment is also applicable to a semiconductor memory using a normal dielectric film for a capacitor structure.

First Embodiment

Hereinafter, a first embodiment will be described in detail with reference to the drawings.

—Method for Manufacturing FeRAM—

In the present embodiment, what is called a planar-type FeRAM is exemplified in which conduction between a lower electrode and an upper electrode of a ferro-electric capacitor structure is secured in the upper of the ferro-electric capacitor structure. It should be noted that a structure of the FeARAM is described along with a method for manufacturing the same for convenience's sake of explanation.

FIG. 1A to FIG. 8B are schematic cross-sectional views illustrating a configuration of an FeRAM according to the first embodiment along with a method for manufacturing the same, in a sequence of process steps.

Figure 1A:
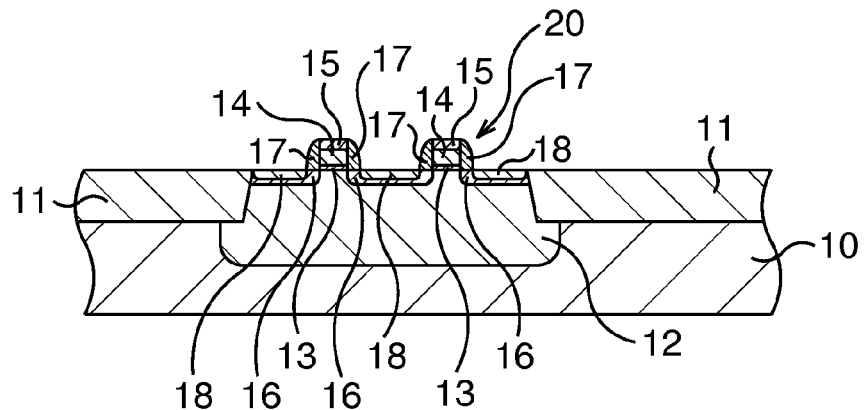
FIG. 1A to FIG. 1D are schematic cross-sectional views illustrating a method for manufacturing an FeRAM according to a first embodiment.

As illustrated in FIG. 1A, a MOS transistor 20 functioning as a selection transistor is formed on a silicon semiconductor substrate 10.

More specifically, an element isolation structure 11 is formed on a surface layer of the silicon semiconductor substrate 10 by an STI (Shallow Trench Isolation) method, for example. Thereby, an active region is defined on the semiconductor substrate 10.

An impurity, here, boron (B) being a p-type impurity, for example, is ion-implanted into the element active region under a condition of a doze amount of $3.0 \times 10^{13}/cm^2$ and an acceleration energy of 300 keV, for example. Thereby, a well 12 is formed.

A thin gate insulation film 13 of about 3.0 nm in film thickness is formed in the active region by thermal oxidation or the like. A polycrystalline silicon film of about 180 nm in film thickness and a silicon nitride film of 29 nm in film thickness, for example, are sequentially deposited on the gate insulation film 13 by a CVD method or the like. The silicon nitride film, the polycrystalline silicon film, and the gate insulation film 13 are processed into an electrode shape by lithography and subsequent dry-etching. Thereby, a gate electrode 14 is formed on the gate insulation film 13. On this occasion, simultaneously, a cap film 15 made of a silicon nitride film is formed on the gate electrode 14.

An impurity, here, arsenic (As) being an n-type impurity, for example, is ion-implanted into the element active region by using the cap film 15 as a mask, under a condition of a doze amount of $5.0 \times 10^{14}/cm^2$ and an acceleration energy of 10 keV, for example. Thereby, what is called an LDD region 16 is formed.

A silicon oxide film, for example, is deposited on an entire surface by a CVD method or the like, and an entire surface of the silicon oxide film is anisotropically dry-etched (etch backed). Thereby, the silicon oxide film is left only on side surfaces of the gate electrode 14 and the cap film 15, whereby a sidewall insulation film 17 is formed.

An impurity, here, phosphor (P) being an n-type impurity, for example, is ion-implanted into the active region by using the cap film 15 and the sidewall insulation film 17 as a mask, under a condition that an impurity density becomes higher than that of the LDD region 16. Thereby, a source/drain region 18 overlapped on the LDD region 16 is formed, whereby the MOS transistor 20 is formed.

Figure 1B:
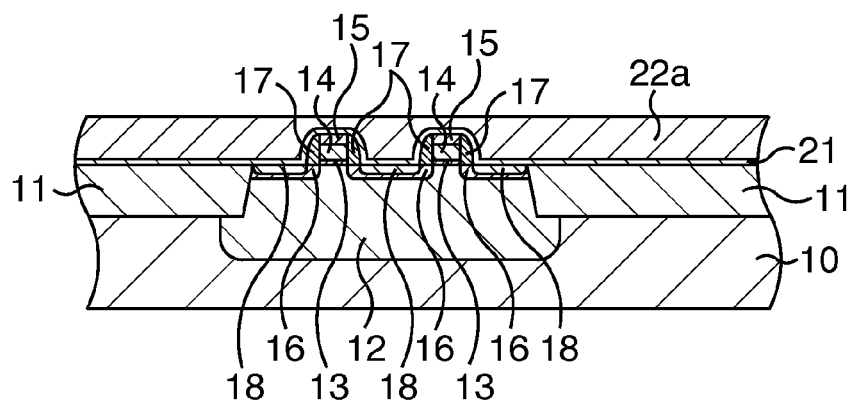

Subsequently, as illustrated in FIG. 1B, a protective film 21 of the MOS transistor 20 and an interlayer insulation film 22a are sequentially formed.

More specifically, the protective film 21 and the interlayer insulation film 22a are sequentially deposited in a manner to cover the MOS transistor 20. Here, as the protective film 21, a silicon oxide film as a material is deposited to be about 20 nm in film thickness by a CVD method or the like. As the interlayer insulation film 22a, first, there is formed a stacked structure made by sequentially film-forming a plasma SiO film (about 20 nm in film thickness), a plasma SiN film (about 80 nm in film thickness), and a plasma TEOS film (about 1000 nm in film thickness), for example. After stacking, polishing is performed by CMP to achieve a film thickness of about 700 nm. Thereby, the interlayer insulation film 22a is formed.

Figure 1C:
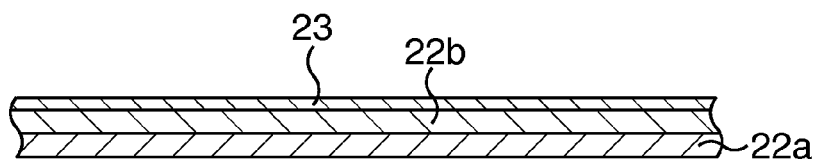

Subsequently, as illustrated in FIG. 1C, an interlayer insulation film 22b and a protective film 23 are sequentially formed.

It should be noted that in each diagram from FIG. 1C, only a configuration of an upper portion of the interlayer insulation film 22a is illustrated for convenience's sake of illustration, and illustration of the silicon semiconductor substrate 10, the MOS transistor 20 and so on is omitted.

More specifically, a silicon oxide film is deposited on the interlayer insulation film 22a to be about 100 nm in film thickness by a plasma CVD method or the like using TEOS, for example. Thereby, the interlayer insulation film 22b is formed. Thereafter, the interlayer insulation film 22b is subjected to an annealing treatment. As for a condition of such an annealing treatment, while $N_2$ gas is supplied at a flow rate of 20 litters/min, the annealing treatment is performed at 650° C. for 20 minutes to 45 minutes, for example.

On the interlayer insulation film 22b is formed the protective film 23 for preventing infiltration of hydrogen or water into a ferro-electric film of a ferro-electric capacitor structure which will be described later.

As the protective film 23, alumina ($Al_2O_3$) as a material is deposited to be about 20 nm to 50 nm in film thickness by a sputtering method or the like. A concrete film-forming condition is that an $Al_2O_3$ target is used, a charging power is 2 kW, Ar is supplied at a flow rate of 22 sccm as sputter gas, and film-forming is performed for 44 seconds. Thereby, the protective film 23 made of alumina of about 20 nm in film thickness is formed. Thereafter, the protective film 23 is subjected to the annealing treatment. As for a condition of such an annealing treatment, while $O_2$ gas is supplied at a flow rate of 2 litters/min, the annealing treatment is performed at 650° C. for 30 minutes to 120 minutes, for example.

Figure 1D:
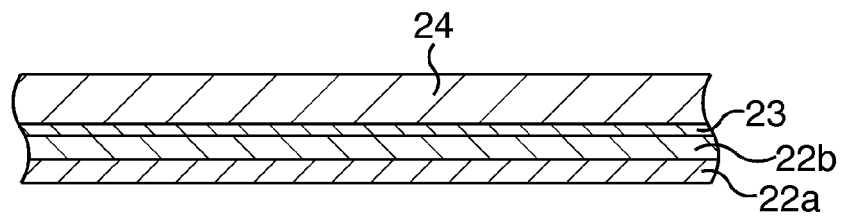

Subsequently, as illustrated in FIG. 1D, a lower electrode film 24 to be the lower electrode is formed.

More specifically, Pt is deposited by a sputtering method or the like thereby to form the lower electrode film 24. A concrete film-forming condition is that a Pt target is used, a charging power is 0.44 kW, Ar is supplied at a flow rate of 119 sccm as sputter gas, and film-forming is performed at a film-forming temperature of 350° C. for 180 seconds. Thereby, the lower electrode film 24 made of Pt of about 153 nm in film thickness is formed.

Figure 2A:
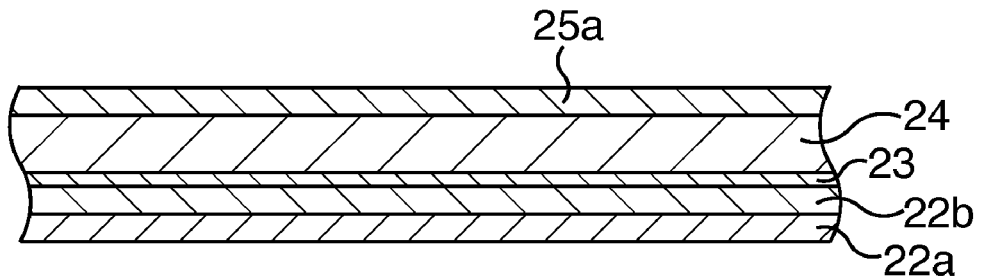
FIG. 2A to FIG. 2C are schematic cross-sectional views illustrating the method for manufacturing the FeRAM according to the first embodiment continued from FIG. 1D.

Subsequently, as illustrated in FIG. 2A, a first ferro-electric film 25a to be a lower layer of a capacitor film is formed.

More specifically, Pb $(Zr_x, Ti_{1-x})O_3 (0<x<1)$ (PZT) is deposited to be about 50 nm to 120 nm in film thickness, for example, by a sputtering method or the like thereby to form the first ferro-electric film 25a. A concrete film-forming condition is that a PZT target is used, a charging power is 1 kW, Ar is supplied at a flow rate of 18 sccm as sputter gas, and film-forming is performed at a film-forming temperature of 50° C. for 112 seconds. Thereby, the first ferro-electric film 25a of about 70 nm in film thickness and made of PZT of 1.13 in Pb amount is formed on the lower electrode film 24. The first ferro-electric film 25a is formed in an amorphous state.

As a material of the first ferro-electric film 25a, there can be also used PZT or the like to which an element such as Ca, Sr, La, Nb, Ta, Ir, W, or Ru is added.

Figure 2B:
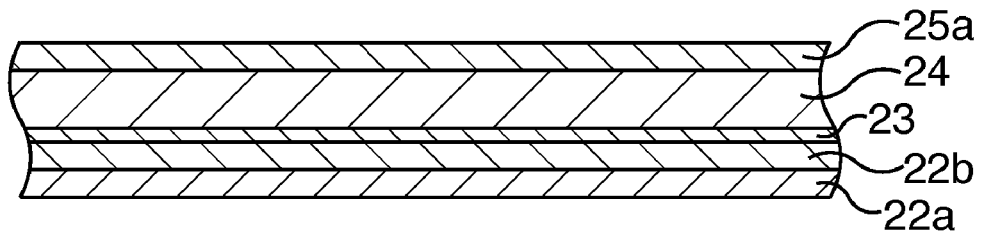

Subsequently, as illustrated in FIG. 2B, the semiconductor substrate 10 is subjected to a heat treatment (first heat treatment).

More specifically, as the first heat treatment, by using a predetermined rapid thermal annealing apparatus, the semiconductor substrate 10 is subjected to a rapid thermal annealing (RTA) treatment thereby to crystallize the first ferro-electric film 25a. A concrete heat treatment condition is that Ar is supplied at a flow rate of 1.975 slm and $O_2$ is supplied at a flow rate of 25 sccm as atmosphere gas, a treatment temperature is about 450° C. to 700° C., here, at 582° C., and a treatment time is for 20 seconds to 300 seconds, here, for 90 seconds. Thereby, the first ferro-electric film 25a which has been in the amorphous state at a beginning of film-forming is crystallized.

In the above-described RTA treatment, if the treatment temperature is lower than 450° C. or the treatment time is shorter than 20 seconds, there is an anxiety that the first ferro-electric film 25a is not crystallized sufficiently or an anxiety that a leak current is increased. Further, if the treatment temperature is higher than 700° C. or the treatment time is longer than 300 seconds, there is an anxiety that the leak current is increased. Therefore, keeping the treatment temperature and the treatment time to be values within ranges described above enables sufficient crystallization of the first ferro-electric film 25a without an increase of the leak current.

Figure 2C:
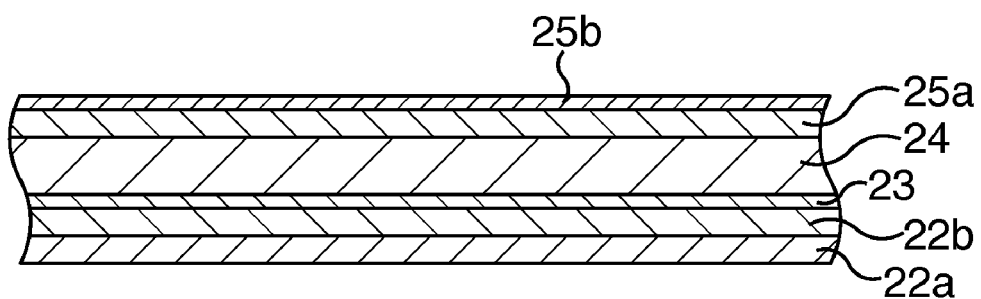

Subsequently, as illustrated in FIG. 2C, a second ferro-electric film 25b to be an upper layer of the capacitor film is formed.

More specifically, PZT is deposited to be thinner than the first ferro-electric film 25a, about 5 nm to 40 nm in film thickness, for example, by a sputtering method or the like thereby to form the second ferro-electric film 25b. A concrete film-forming condition is that a PZT target is used, a charging power is 1 kW, Ar is supplied at a flow rate of 18 sccm as sputter gas, and film-forming is performed at a film-forming temperature of 50° C. for 19 seconds. Thereby, the second ferro-electric film 25b of about 10 nm in film thickness and made of PZT of 1.13 in Pb amount is formed on the first ferro-electric film 25b. The second ferro-electric film 25b is formed in an amorphous state.

As a material of the second ferro-electric film 25b, there can be also used PZT or the like to which an element such as Ca, Sr, La, Nb, Ta, Ir, W, or Ru is added.

Figure 3A:
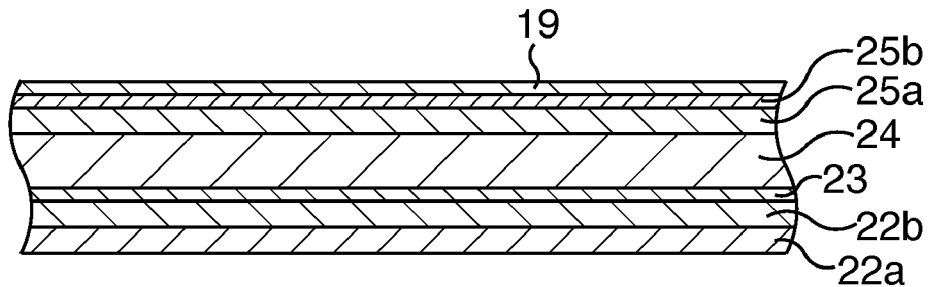
FIG. 3A to FIG. 3C are schematic cross-sectional views illustrating the method for manufacturing the FeRAM according to the first embodiment continued from FIG. 2C.

Subsequently, as illustrated in FIG. 3A, an $SrRuO_3$ (SRO) film 19 is formed.

More specifically, SRO is deposited to be about 1 nm to 5 nm in film thickness, for example, by a sputtering method or the like thereby to form the SRO film 19. A concrete film-forming condition it that an SRO target is used, a charging power is 0.31 kW, Ar is supplied at a flow rate of 100 sccm as sputter gas, and film-forming is performed at a film-forming temperature of 60° C. for 2 seconds. Thereby, the SRO film 19 of about 1 nm in film thickness is formed on the second ferro-electric film 25b. The SRO film 19 is formed in an amorphous state. Forming of the SRO film on a capacitor of a ferro-electric enables a high polarization inversion amount in the capacitor structure even when the capacitor film is formed to be thin. Based on consideration described later, by forming the SRO film 19 to be about 1 nm to 5 nm in film thickness, it becomes possible to obtain a large polarization inversion amount.

Figure 3B:
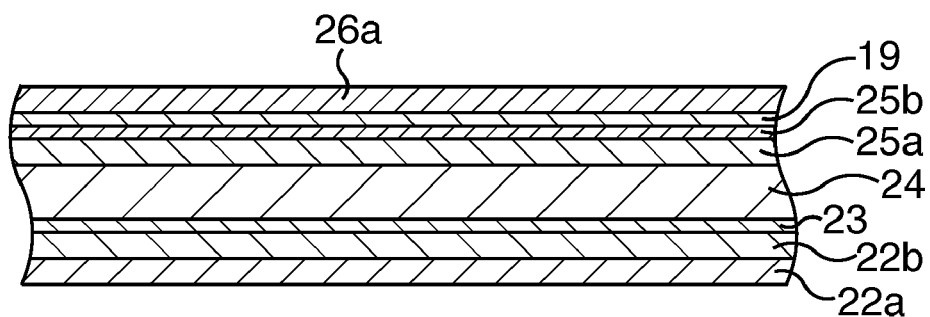

Subsequently, as illustrated in FIG. 3B, a first upper electrode film 26a to be a lower layer of an upper electrode is formed.

More specifically, $IrO_2$ is deposited to be about 10 nm to 200 nm in film thickness, for example, by a sputtering method or the like thereby to form the first upper electrode film 26a. A concrete film-forming condition is that an Ir target is used, a charging power is 1.91 kW, Ar is supplied at a flow rate of 100 sccm and $O_2$ is supplied at a flow rate of 52 sccm as sputter gas, and film-forming is performed at a film-forming temperature of 20° C. for 9 seconds. Thereby, the first upper electrode film 26a made of $IrO_2$ of about 49 nm in film thickness is formed on the SRO film 19.

As a material of the first upper electrode film 26a, there can be also used a conductive oxide or the like of Ir, Ru, $RuO_2$ or others instead of $IrO_2$.

Figure 3C:
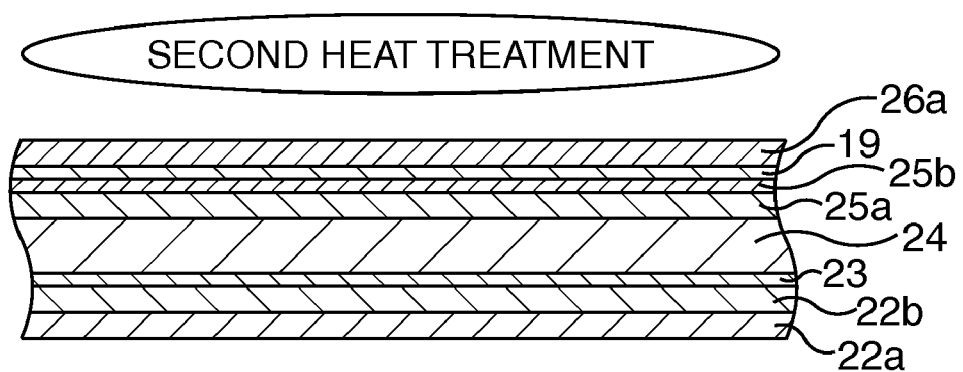

Subsequently, as illustrated in FIG. 3C, the semiconductor substrate 10 is subjected to a heat treatment (second heat treatment).

More specifically, as the second heat treatment, by using a predetermined rapid thermal annealing apparatus, the semiconductor substrate 10 is subjected to an RTA treatment thereby to crystallize the second ferro-electric film 25b and the SRO film 19. A concrete heat treatment condition is that Ar is supplied at a flow rate of 1.98 slm and $O_2$ is supplied at a flow rate of 20 sccm as atmosphere gas, a treatment temperature is about 550° C. to 800° C., here, at 732° C., and a treatment time is for 30 seconds to 300 seconds, here, for 118 seconds. Thereby, the second ferro-electric film 25b and the SRO film 19 which have been in the amorphous states at the beginning of film-forming are crystallized.

In the above-described RTA treatment, if the treatment temperature is lower than 550° C. or the treatment time is shorter than 30 seconds, there is an anxiety that the second ferro-electric film 25b (and the SRO film 19, in particular the second ferro-electric film 25b) is not crystallized sufficiently or an anxiety that a leak current is increased. Further, if the treatment temperature is higher than 800° C. or the treatment time is longer than 300 seconds, there is an anxiety that an unexpected influence occurs to the first ferro-electric film 25a and an anxiety that a leak current is increased. Therefore, keeping the treatment temperature and the treatment time to be values within ranges described above enables prevention of a bad influence to the first ferro-electric film 25a and sufficient crystallization of the second ferro-electric film 25b without an increase of the leak current.

Figure 4A:
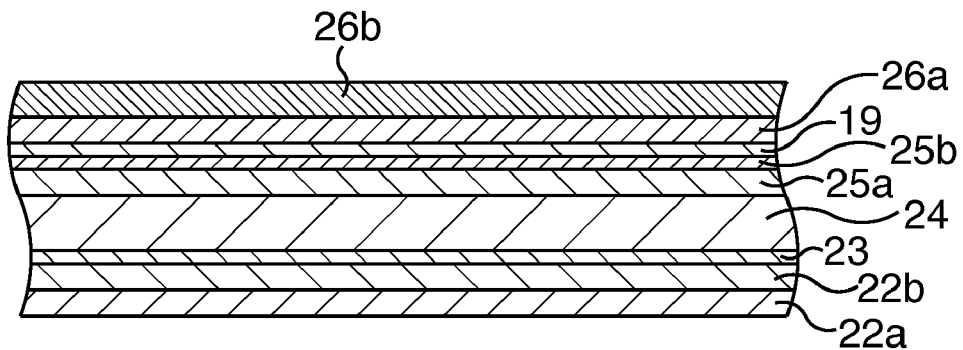
FIG. 4A to FIG. 4C are schematic cross-sectional views illustrating the method for manufacturing the FeRAM according to the first embodiment continued from FIG. 3C.

Subsequently, as illustrated in FIG. 4A, a second upper electrode film 26b to be an upper layer of the upper electrode is formed.

More specifically, $IrO_2$ is deposited to be about 25 nm to 250 nm in film thickness, for example, by a sputtering method or the like thereby to form the second upper electrode film 26b. A concrete film-forming condition is that an Ir target is used, a charging power is 1.03 kW, Ar is supplied at a flow rate of 100 sccm and $O_2$ is supplied at a flow rate of 90 sccm as sputter gas, and film-forming is performed at a film-forming temperature of 20° C. for 28 seconds. Subsequently, at a charging power of 2.03 kW, Ar being supplied at a flow rate of 100 sccm and $O_2$ being supplied at a flow rate of 90 sccm as sputter gas, film-forming is performed at a film-forming temperature of 20° C. for 4.4 seconds. Thereby, the second upper electrode film 26b made of $IrO_2$ of about 100 nm in film thickness is formed on the first upper electrode film 26a.

As a material of the second upper electrode film 26b, there can be also used a conductive oxide or the like of Ir, Ru, $RuO_2$ or others instead of $IrO_2$.

Figure 4B:
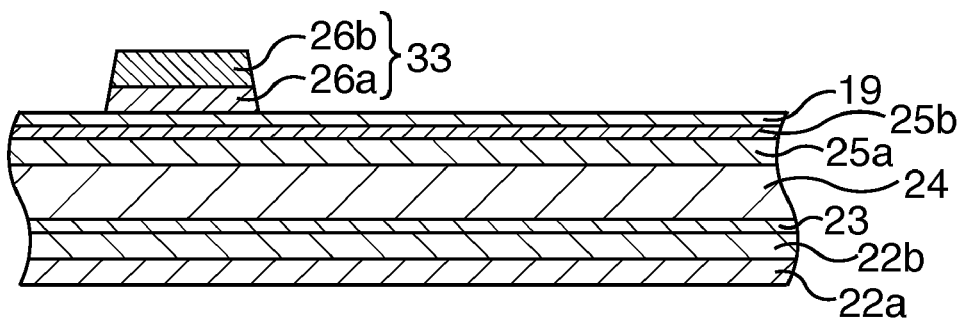

Subsequently, as illustrated in FIG. 4B, an upper electrode 33 is formed.

More specifically, the first and second upper electrode films 26a, 26b are processed into a plurality of electrode shapes by lithography and subsequent dry-etching. Thereby, the upper electrode 33 constituted by the first and second upper electrode films 26a, 26b is formed.

Figure 4C:
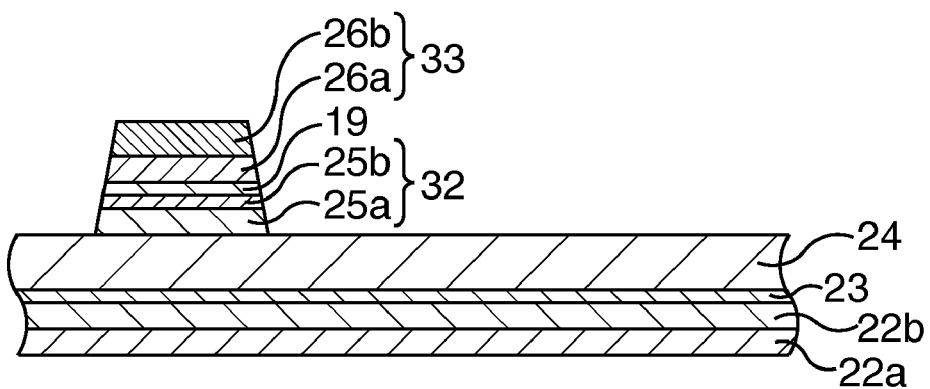

Subsequently, as illustrated in FIG. 4C, a capacitor film 32 is formed.

More specifically, the SRO film 19 and the first and second ferro-electric films 25a, 25b are adjusted to the upper electrode 33 and processed by lithography and subsequent dry-etching. Thereby, the SRO film 19 is processed and the capacitor film 32 constituted by the first and second ferro-electric films 25a, 25b is formed.

After forming of the capacitor film 32, the capacitor film 32 is subjected to a heat treatment in order to recover a function of the capacitor film 32.

Figure 5A:
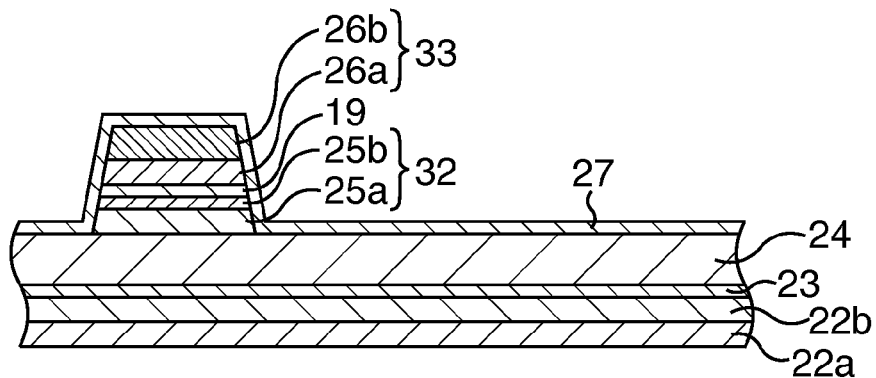
FIG. 5A to FIG. 5C are schematic cross-sectional views illustrating the method for manufacturing the FeRAM according to the first embodiment continued from FIG. 4C.

Subsequently, as illustrated in FIG. 5A, a protective film 27 for preventing infiltration of hydrogen or water into the capacitor film 32 is formed.

More specifically, alumina ($Al_2O_3$) as a material is deposited to be about 50 nm in film thickness on the lower electrode film 24 by a sputtering method or the like in a manner to cover the capacitor film 32, the SRO film 19, and the upper electrode 33. Thereby, the protective film 27 is formed. Thereafter, the protective film 27 is subjected to an annealing treatment.

Figure 5B:
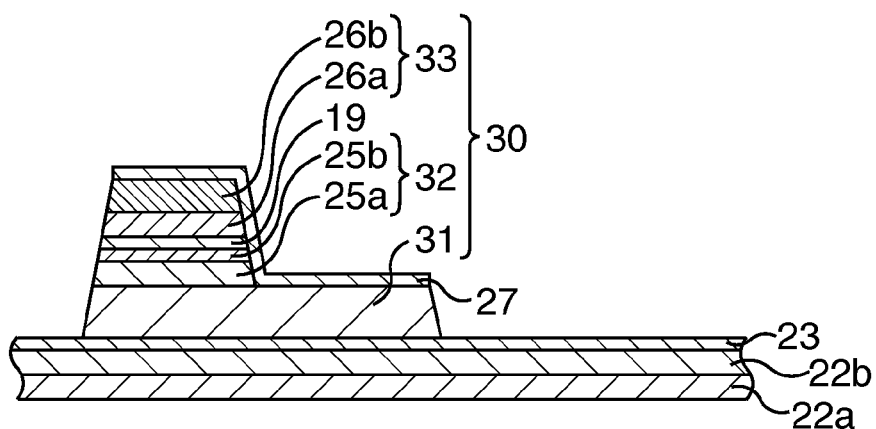

Subsequently, as illustrated in FIG. 5B, the lower electrode film 24 is processed along with the protective film 27 thereby to form a ferro-electric capacitor structure 30.

More specifically, the protective film 27 and the lower electrode film 24 are processed by lithography and subsequent dry-etching in a manner that the protective film 27 and the lower electrode film 24 are adjusted to the processed capacitor film 32 and that the lower electrode film 24 is left larger in size than the capacitor film 32, thereby to form the lower electrode 31. Thereby, there is formed the ferro-electric capacitor structure 30 in which the capacitor film 32, the SRO film 19, and the upper electrode 33 are sequentially stacked on the lower electrode 31. On this occasion, simultaneously, the protective film 27 remains in a manner to cover from an upper surface of the upper electrode 33 to side surfaces of the upper electrode 33, the SRO film 19, and the capacitor film 32, and an upper surface of the lower electrode 31. Thereafter, the protective film 27 is subjected to a heat treatment.

Figure 5C:
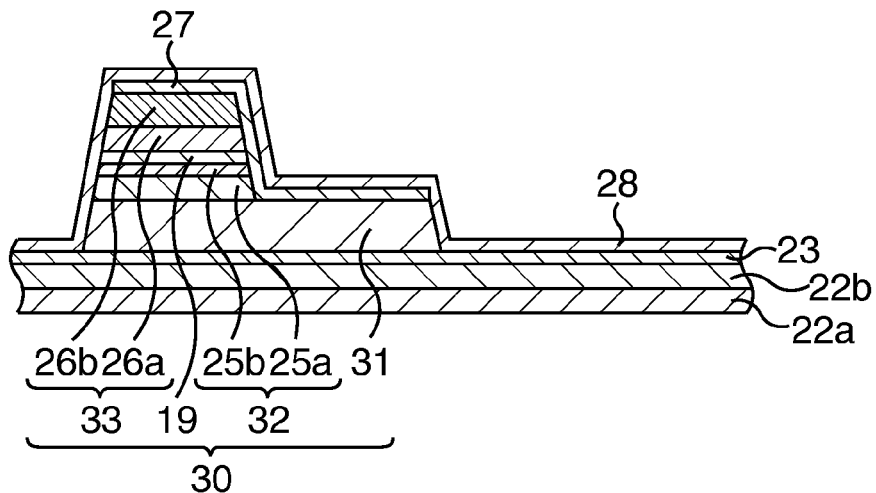

Subsequently, as illustrated in FIG. 5C, a protective film 28 is formed.

More specifically, alumina ($Al_2O_3$) as a material is deposited to be about 20 nm to 50 nm in film thickness by a sputtering method or the like in a manner to cover the ferro-electric capacitor structure 30 and the protective film 27. Thereby, the protective film 28 is formed. Thereafter, the protective film 28 is subject to a heat treatment.

Figure 6A:
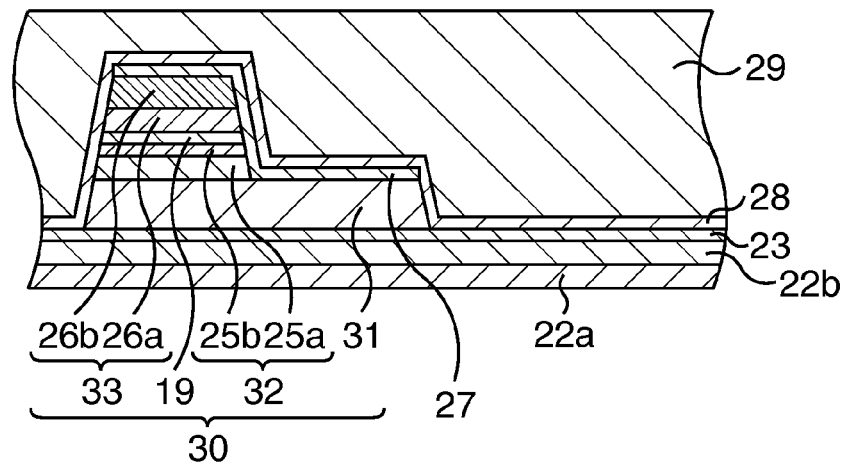
FIG. 6A to FIG. 6C are schematic cross-sectional views illustrating the method for manufacturing the FeRAM according to the first embodiment continued from FIG. 5C.

Subsequently, as illustrated in FIG. 6A, an interlayer insulation film 29 is film-formed.

More specifically, the interlayer insulation film 29 is formed in a manner to cover the ferro-electric capacitor structure 30 via the protective films 27, 28. Here, the interlayer insulation film 29 is formed as a result that a silicon oxide film is deposited to be about 1500 nm to 2500 nm in film thickness by a plasma CVD method using TEOS, for example, or the like, and thereafter polished to be about 1000 nm in film thickness, for example, by CMP. After CMP, for the purpose of dehydration of the interlayer insulation film 29, a plasma annealing treatment of $N_2O$, for example, is performed.

Figure 6B:
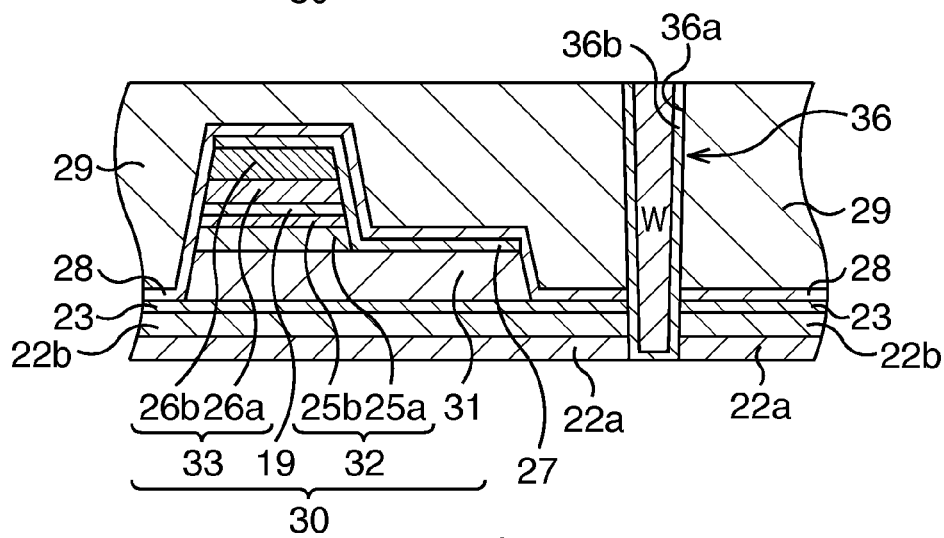

Subsequently, as illustrated in FIG. 6B, a conductive plug 36 to be connected to the source/drain region 18 of the MOS transistor 20 is formed.

More specifically, the interlayer insulation film 29, the protective films 28, 27, the interlayer insulation films 22b, 22a, and the protective film 21 are processed by lithography and subsequent dry-etching. Such dry-etching is performed, by using the source/drain region 18 as an etching stopper, until a part of a surface of the source/drain region 18 is exposed. Thereby, a via hole 36a of about 0.3 µm in diameter, for example, is formed.

A Ti film and a TiN film, for example, are sequentially deposited to be about 20 nm in film thickness and about 50 nm in film thickness by a sputtering method or the like in a manner to cover a wall surface of the via hole 36a. Thereby, abase film (glue film) 36b is formed. A W film, for example, is formed in a manner to fill the via hole 36a via the glue film 36b by a CVD method or the like. The W film and the glue film 36b are polished by CMP by using the interlayer insulation film 29 as a stopper. Thereby, the conductive plug 36 to fill the inside of the via hole 36a with W via the glue film 36b is formed. After CMP, a plasma annealing treatment of $N_2O$, for example, is performed.

Figure 6C:
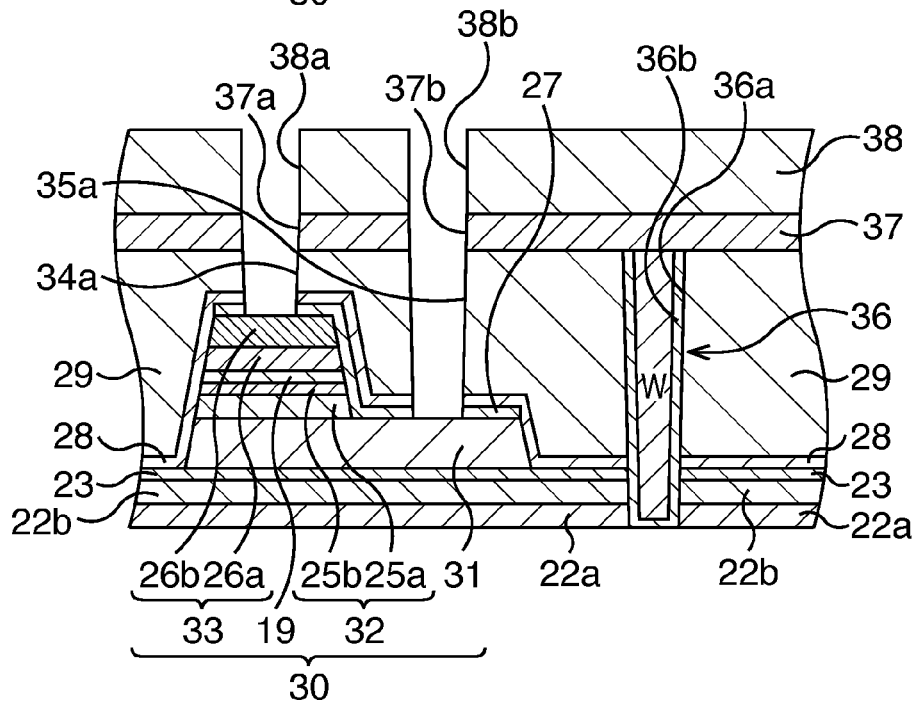

Subsequently, as illustrated in FIG. 6C, after a hard mask 37 and a resist mask 38 are formed, via holes 34a, 35a to the ferro-electric capacitor structure 30 are formed.

More specifically, a silicon nitride film is deposited to be about 100 nm in film thickness on the interlayer insulation film 29 by a CVD method or the like. Thereby, the hard mask 37 is formed. A resist is applied on the hard mask 37 and the resist is processed by lithography. Thereby, the resist mask 38 having openings 38a, 38b is formed.

The hard mask 37 is dry-etched by using the resist mask 38 thereby to form openings 37a, 37b at portions corresponding to the openings 38a, 38b of the hard mask 37.

The interlayer insulation film 29 and the protective films 28, 27 are dry-etched by mainly using the hard mask 37, with the upper electrode 33 and the lower electrode 31 each being an etching stopper. In the dry-etching, a processing to be performed to the interlayer insulation film 29 and the protective films 28, 27 until a part of a surface of the upper electrode 33 is exposed and a processing to be performed to the interlayer insulation film 29 and the protective films 28, 27 until a part of a surface of the lower electrode 31 is exposed are done at the same time. Thereby, via holes 34a, 35a of about 0.5 µm in diameter, for example, are formed simultaneously in the respective regions.

Figure 7A:
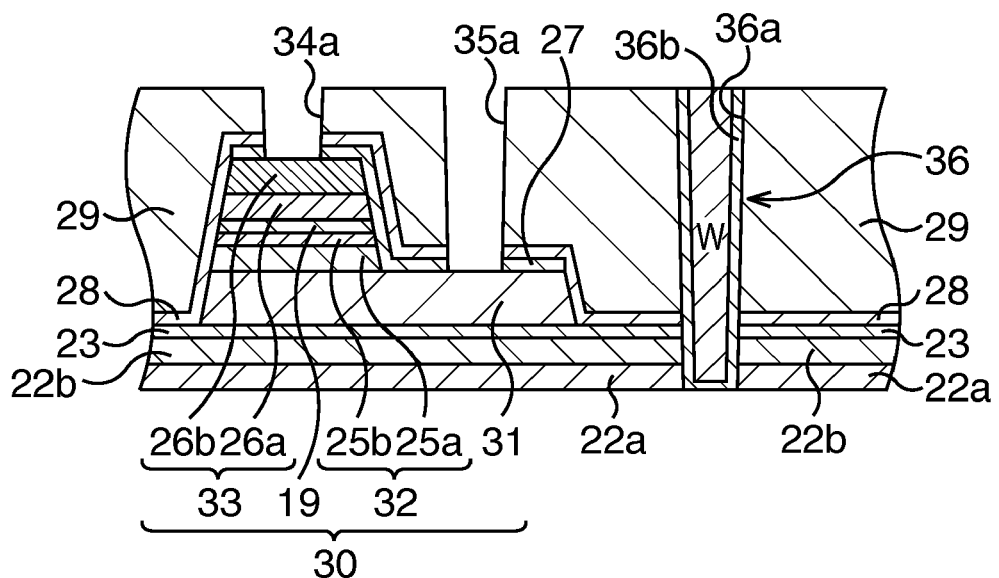
FIG. 7A and FIG. 7B are schematic cross-sectional views illustrating the method for manufacturing the FeRAM according to the first embodiment continued from FIG. 6C.

Subsequently, as illustrated in FIG. 7A, the resist mask 38 and the hard mask 37 are removed.

More specifically, first, the remaining resist mask 38 is removed by an asking treatment or the like. Thereafter, there is performed an annealing treatment for recovering damage on the ferro-electric capacitor structure 30 by various process steps after formation of the ferro-electric capacitor structure 30. Then, the hard mask 37 is removed by overall anisotropic etching, what is called etch back.

Figure 7B:
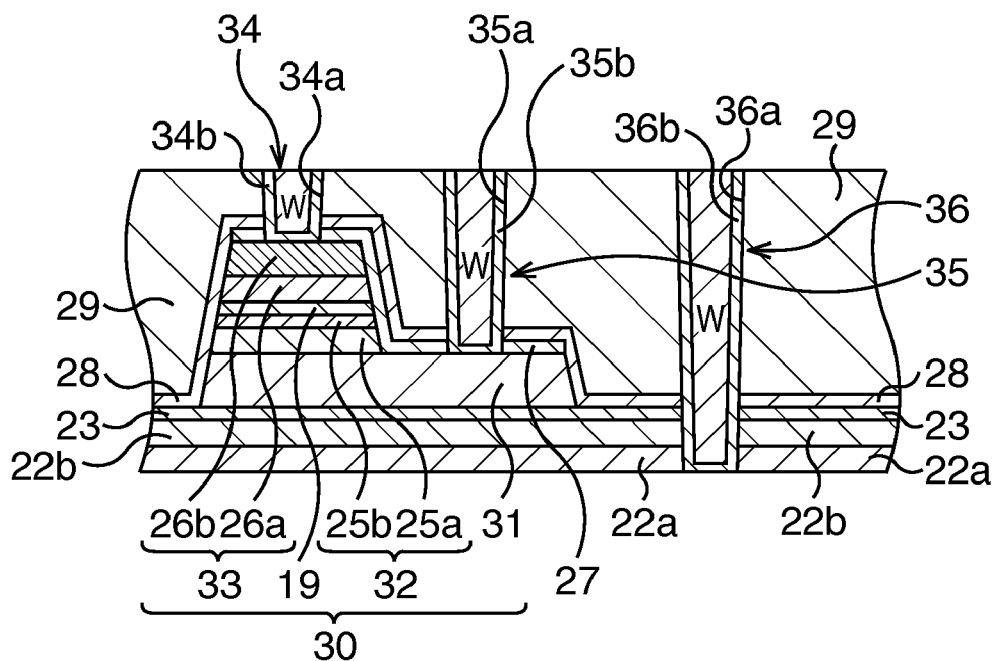

Subsequently, as illustrated in FIG. 7B, conductive plugs 34, 35 to be connected to the ferro-electric capacitor structure 30 are formed.

More specifically, first, after base films (glue films) 34b, 35b are formed in a manner to cover wall surfaces of the via holes 34a, 35a, a W film is formed in a manner to fill the via holes 34a, 35a via the glue films 34b, 35b. Then, by using the interlayer insulation film 29 as a stopper, the W film and the glue films 34b, 35b, for example, are polished by CMP. Thereby, the conductive plugs 34, 35 to fill the inside of the via holes 34a, 35a with W via the glue films 34b, 35b are formed. After CMP, a plasma annealing treatment of $N_2O$, for example, is performed.

Figure 8A:
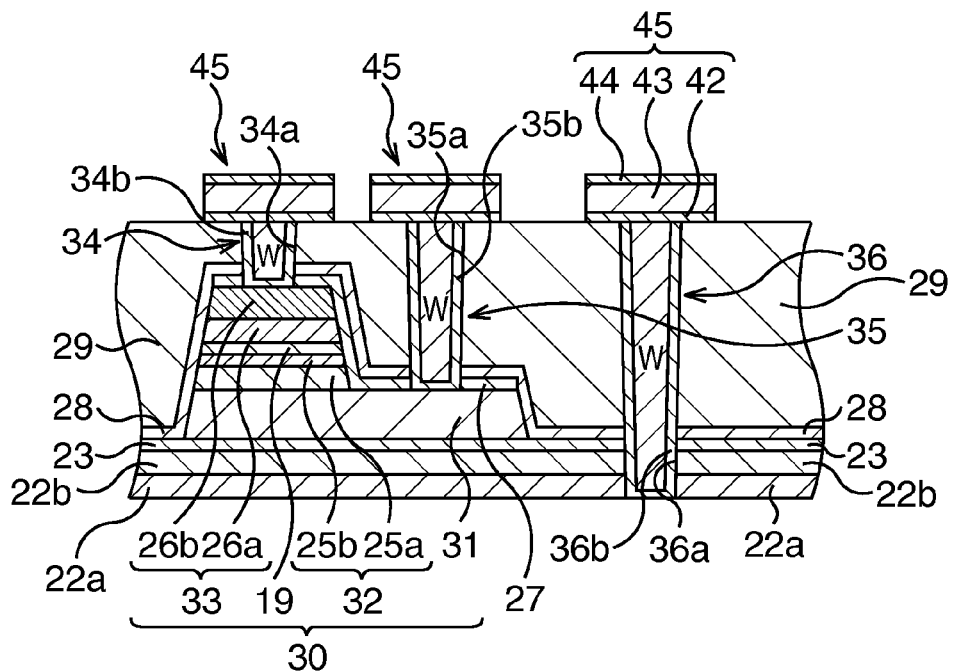
FIG. 8A and FIG. 8B are schematic cross-sectional views illustrating the method for manufacturing the FeRAM according to the first embodiment continued from FIG. 7B.

Subsequently, as illustrated in FIG. 8A, a first wiring 45 to be each connected to the conductive plugs 34, 35, 36 is formed.

More specifically, a barrier metal film 42, a wiring film 43, and a barrier metal film 44 are deposited on an entire surface of the interlayer insulation film 29 by a sputtering method or the like. As the barrier metal film 42, a Ti film is stacked and film-formed to be about 5 nm in film thickness and a TiN film is stacked and film-formed to be about 150 nm in film thickness, for example, by a sputtering method or the like. As the wiring film 43, an Al alloy film (here, Al—Cu film), for example, is film-formed to be about 350 nm in film thickness. As the barrier metal film 44, a Ti film is stacked and film-formed to be about 5 nm in film thickness and a TiN film is stacked and film-formed to be about 150 nm in film thickness, for example, by a sputtering method or the like. Here, since a structure of the wiring film 43 is the same as a structure of a logic part of other than an FeRAM of the same rule, there is no problem in a processing of the wiring and its reliability.

After an SiON film or an antireflection film (not illustrated), for example, is film-formed as an antireflection film, the antireflection film, the barrier metal film 44, the wiring film 43 and the barrier metal film 42 are processed into a wiring shape by lithography and subsequent dry-etching. Thereby, the first wiring 45 each to be connected to the conductive plugs 34, 35, 36, is formed. It should be noted that instead of forming the Al alloy film as the wiring film 43, a Cu film (or a Cu alloy film) can be formed by using what is called a damascene method or the like thereby to form a Cu wiring as the first wiring 45.

Figure 8B:
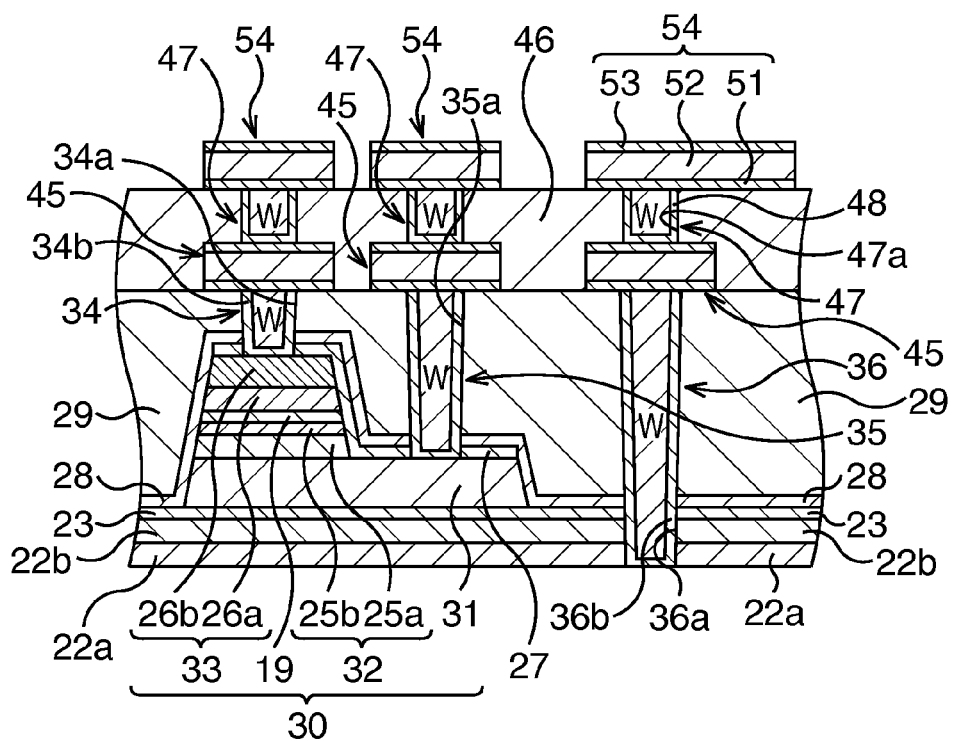

Subsequently, as illustrated in FIG. 8B, a second wiring 54 to be connected to the first wiring 45 is formed.

More specifically, an interlayer insulation film 46 is formed in a manner to cover the first wiring 45. As the interlayer insulation film 46, a silicon nitride film is film-formed to be about 700 nm in film thickness and a plasma TEOS film is formed to make an entire film thickness be about 1100 nm, and thereafter, a surface is polished by CMP thereby to form the film thickness to be about 750 nm.

A conductive plug 47 to be connected to the first wiring 45 is formed.

The interlayer insulation film 46 is processed by lithography and subsequent dry-etching until a part of a surface of the first wiring 45 is exposed. Thereby, a via hole 47a of about 0.25 µm in diameter, for example, is formed.

After a base film (glue film) 48 is formed in a manner to cover a wall surface of the via hole 47a, a W film is formed by a CVD method or the like in a manner to fill the via hole 47a via the glue film 48. Then, the W film and the glue film 48, for example, are polished by using the interlayer insulation film 46 as a stopper. Thereby, the conductive plug 47 to fill the inside of the via hole 47a with W via the glue film 48 is formed.

The second wiring 54 to be each connected to the conductive plug 47 is formed.

First, a barrier metal film 51, a wiring film 52, and a barrier metal film 53 are deposited on an entire surface by a sputtering method or the like. As the barrier metal film 51, a Ti film is stacked and film-formed to be about 5 nm in film thickness and a TiN film is stacked and film-formed to be about 150 nm in film thickness, for example, by a sputtering method or the like. As the wiring film 52, an Al alloy film (here, Al—Cu film) is film-formed to be about 350 nm in film thickness, for example. As the barrier metal film 53, a Ti film is stacked and film-formed to be about 5 nm in film thickness and a TiN film is stacked and film-formed to be about 150 nm in film thickness, for example, by a sputtering method or the like. Here, since a structure of the wiring film 52 is the same as a structure of a logic part of other than n FeRAM of the same rule, there is no problem in a processing of wiring and its reliability.

After an SiON film or an antireflection film (not illustrated), for example, is film-formed as an antireflection film, the antireflection film, the barrier metal film 53, the wiring film 52 and the barrier metal film 51 are processed into a wiring shape by lithography and subsequent dry-etching. Thereby, the second wiring 54 is formed. It should be noted that instead of forming the Al alloy film as the wiring film 52, a Cu film (or a Cu alloy film) can be formed by using what is called a damascene method or the like thereby to form a Cu wiring as the second wiring 54.

Thereafter, after various process steps such as forming of an interlayer insulation film, an upper layer wiring and so on, the planar-type FeRAM according to the present embodiment is formed.

—Advantage of FeRAM According to the Present Embodiment—

Hereinafter, an advantage of an FeRAM fabricated according to the present embodiment will be described based on a comparison with a comparative example.

Figure 9:
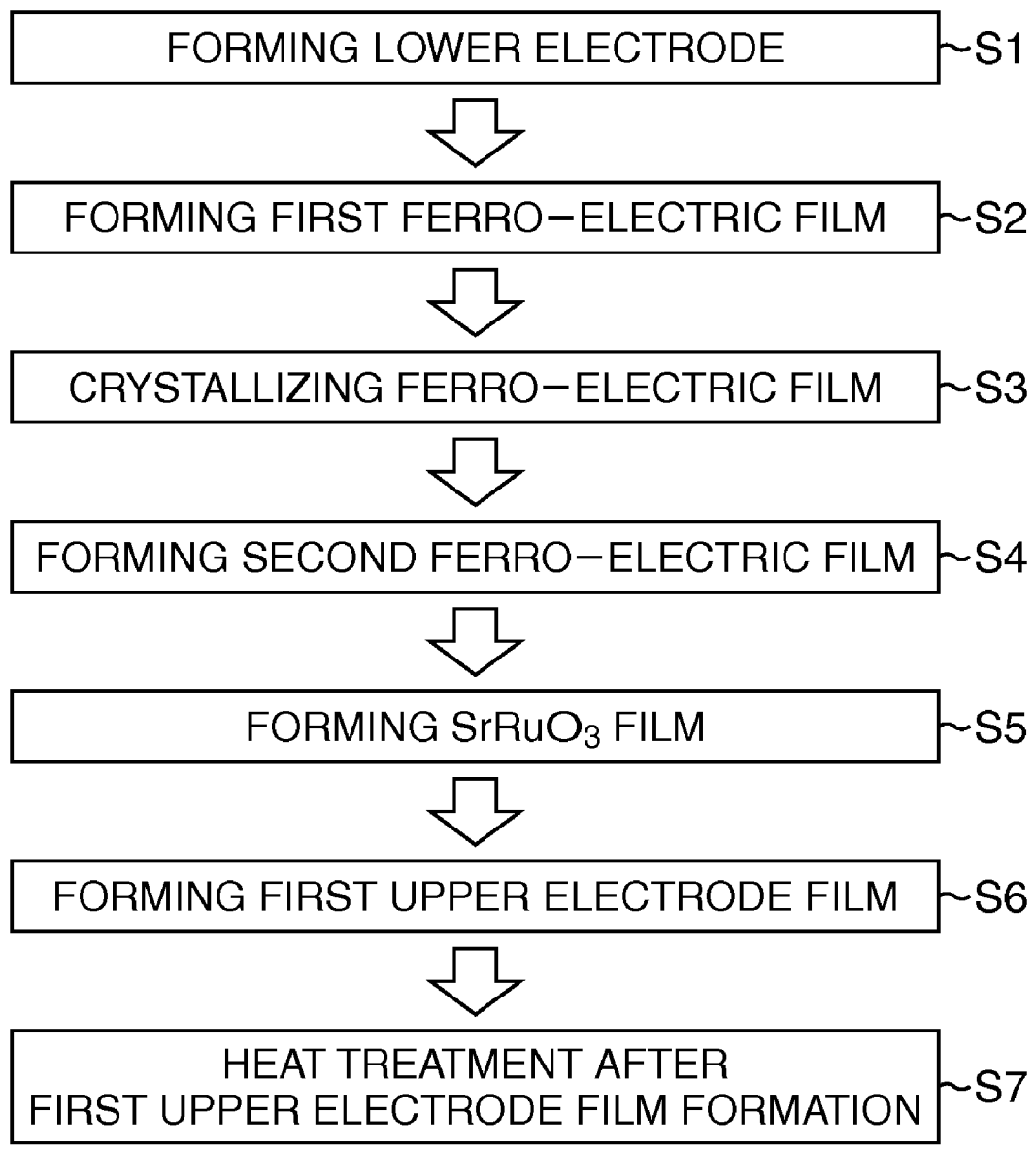
FIG. 9 is a flowchart illustrating main process steps in the method for manufacturing the FeRAM according to the first embodiment.

In a method for manufacturing the FeRAM according to the present embodiment, main process steps illustrated in FIG. 9 are performed when a ferro-electric capacitor structure 30 being a component is formed.

In the present embodiment, as in FIG. 1D described above, a lower electrode film is formed (step S1). As in FIG. 2A, a first ferro-electric film is formed (step S2). As in FIG. 2B, the first ferro-electric film is crystallized by a first heat treatment (step S3). As in FIG. 2C, a second ferro-electric film is formed (step S4). As in FIG. 3A, an SRO film is formed (step S5). As in FIG. 3B, a first upper electrode film is formed (step S6). As in FIG. 3C, the second ferro-electric film and the SRO film are crystallized by a second heat treatment (step S7).

In the present embodiment, in order for the comparison with the comparative example, two kinds of SRO films of 1 nm and 5 nm in film thickness are formed in the step S5. In a case of the former, a film-forming condition thereof is the same as a condition exemplified by using FIG. 3A. In a case of the latter, a film-forming condition is that an SRO target is used, a charging power is 0.31 kW, Ar is supplied at a flow rate of 100 sccm as sputter gas, and film-forming is performed at a film-forming temperature of 60° C. for 11 seconds. Thereby, the SRO film of about 5 nm in film thickness is formed.

Figure 10:
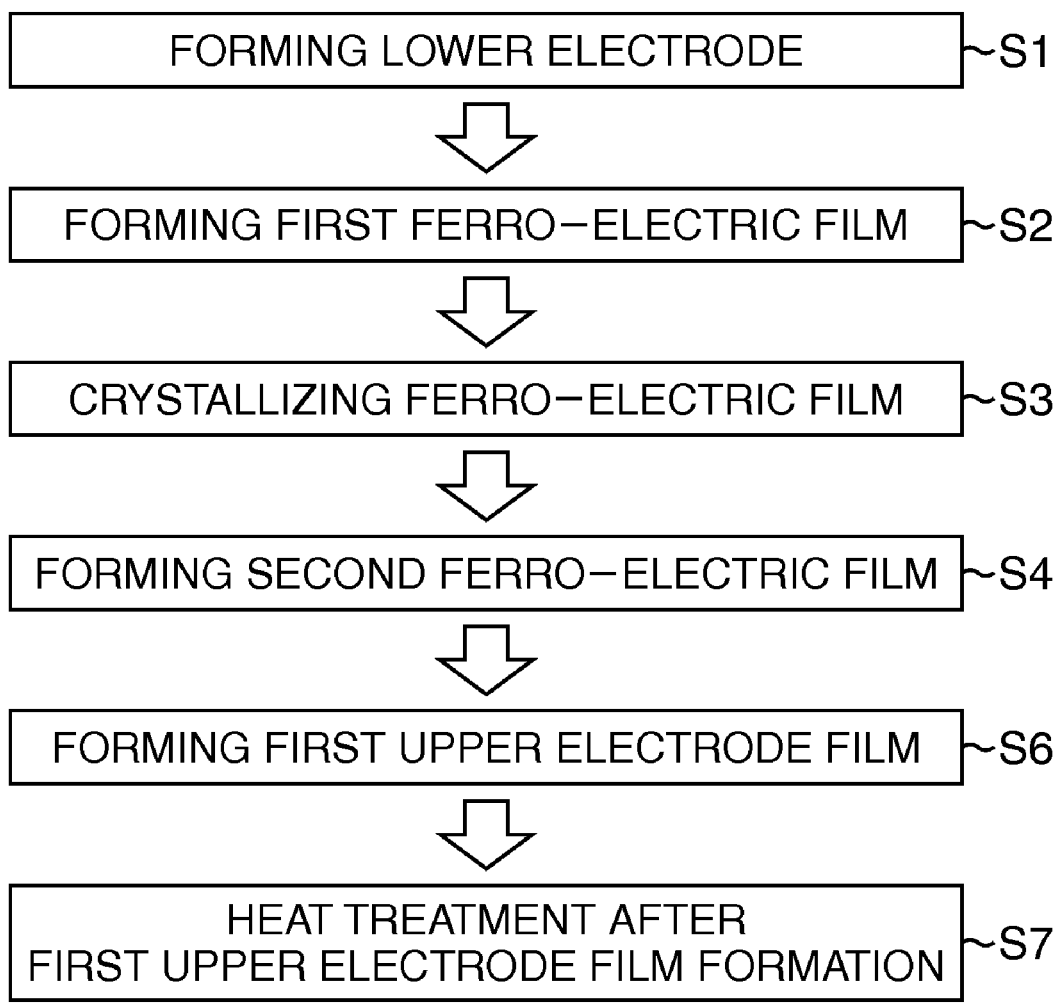
FIG. 10 is a flowchart illustrating main process steps in a method for manufacturing an FeRAM according to a comparative example 1.

In a comparative example 1, when a ferro-electric capacitor structure 30 being a component is formed, main process steps illustrated in FIG. 10 are performed.

In the comparative example 1, an SRO film is not formed. In other words, a step S1, a step S2, a step S3, a step S4, a step S6, and a step S7 are sequentially performed. A film-forming condition in each step is similar to that of the present embodiment.

In a comparative example 2, when a ferro-electric capacitor structure 30 being a component is formed, main process steps illustrated in FIG. 11 are performed.

In the comparative example 2, a second ferro-electric film is not formed. In other words, a step S1, a step S2, a step S3, a step S5, a step S6, and a step S7 are sequentially performed. A film-forming condition of a first ferro-electric film in the step S1, among the respective steps, is somewhat different from what is exemplified in the present embodiment. The film-forming condition of the step S1 in the comparative example 2 is that a PZT target is used, a charging power is 1 kW, Ar is supplied at a flow rate of 18 sccm as sputter gas, and film-forming is performed at a film-forming temperature of 50° C. for 131 seconds. Thereby, the first ferro-electric film of about 80 nm in film thickness and made of PZT of 1.13 in Pb amount is formed. The SRO film formed in the step S5 is of about 1 nm in film thickness In a comparative example 3, when a ferro-electric capacitor structure 30 being a component is formed, main process steps illustrated in FIG. 12 are performed.

In the comparative example 3, a first heat treatment is not performed and a second ferro-electric film is not formed. In other words, a step S1, a step S2, a step S5, a step S6, and a step S7 are sequentially performed. A film-forming condition of a first ferro-electric film in the step S1, among the respective steps, is somewhat different from what is exemplified in the present embodiment, and is similar to the film-forming condition of the step S1 in the comparative example 2. An SRO film formed in the step S5 is of about 1 nm in film thickness.

Figure 13:
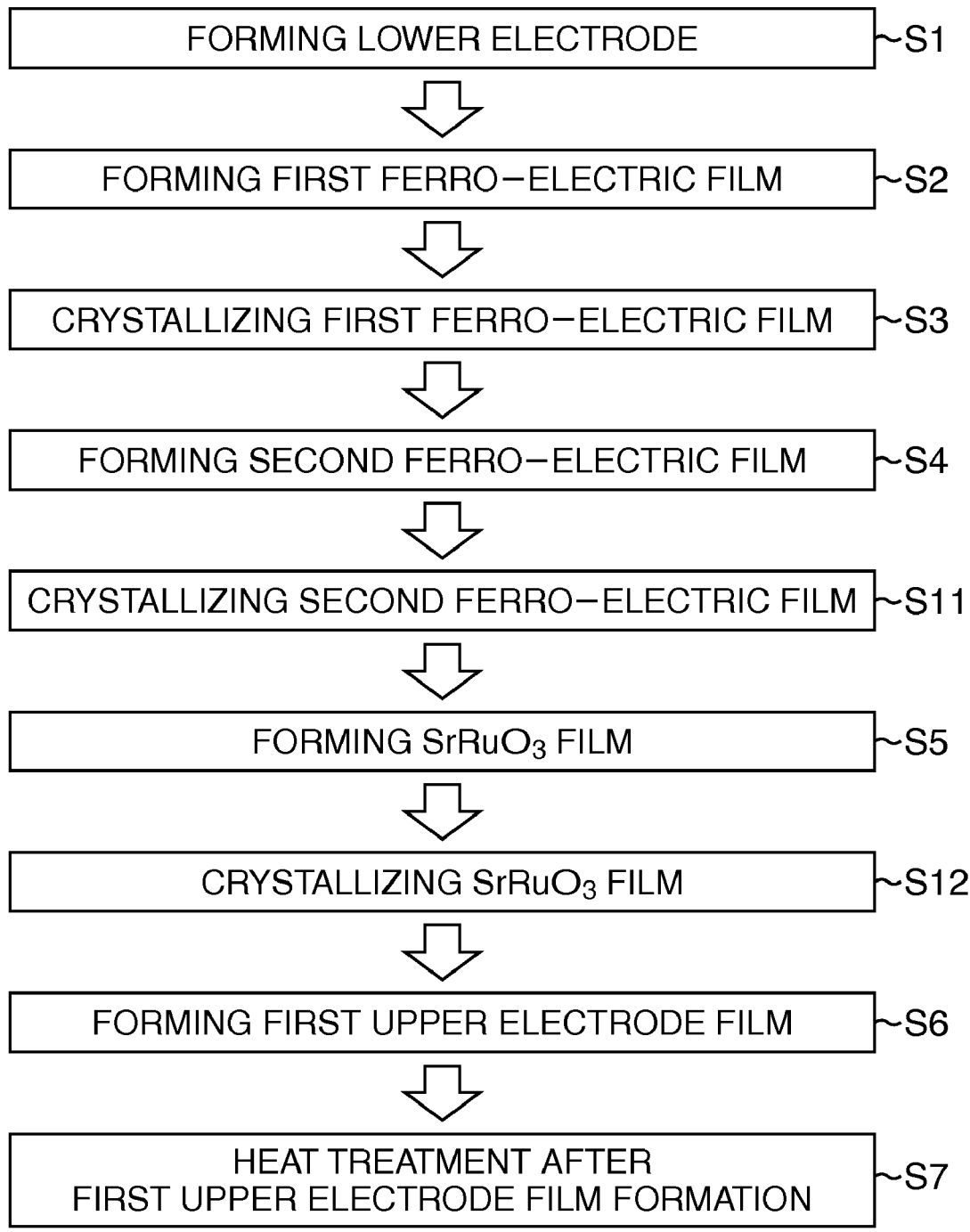
FIG. 13 is a flowchart illustrating main process steps in a method for manufacturing an FeRAM according to a comparative example 4.

In a comparative example 4, when a ferro-electric capacitor structure 30 being a component is formed, main process steps illustrated in FIG. 13 are performed.

In the comparative example 4, a heat treatment is performed each after a first ferro-electric film is formed, after a second ferro-electric film is formed, and after an SRO film is formed. In other words, a step S1, a step S2, a step S3, a step S4, crystallizing the second ferro-electric film by a heat treatment (step S11), a step S5, crystallizing the SRO film by a heat treatment (step S12), a step S6, and a step S7 are sequentially performed. A condition of the first heat treatment in the step S3, among the steps S1 to S7, is somewhat different from what is exemplified in the present embodiment. The heat treatment condition of the step S4 in the comparative example 4 is that Ar is supplied at a flow rate of 1.975 slm and $O_2$ is supplied at a flow rate of 25 sccm as atmosphere gas, a treatment temperature is 620° C., and a treatment time is for 90 seconds. The heat treatment condition of the step S11 is the same as that of the step 4. The heat treatment condition of the step S12 is that $O_2$ is supplied at a flow rate of 2.0 slm as atmosphere gas, a treatment temperature is 642° C., and a treatment time is for 90 seconds. The SRO film formed in the step S5 is of about 5 nm in film thickness.

Table 1 below presents values of polarization inversion amounts ($\mu C/cm^2$) and leak currents (A) measured for the present embodiment and the comparative examples 1, 2, 3, in which the SRO films are formed to be 1 nm in film thickness.

TABLE 1

|  | Polarization inversion amount (at 1.1 V) | Leak current (at 1.1 V) |
| --- | --- | --- |
| Comparative example 1 | 10.5 $\mu C/cm^2$ | $2.59 \times 10^{-10}$ A |
| Comparative example 2 | 6.6 $\mu C/cm^2$ | $7.84 \times 10^{-8}$ A |
| Comparative example 3 | 8.3 $\mu C/cm^2$ | $1.88 \times 10^{-8}$ A |
| Present embodiment (SRO1 nm) | 18.9 $\mu C/cm^2$ | $3.51 \times 10^{-10}$ A |

Table 2 below presents values of polarization inversion amounts ($\mu C/cm^2$) and leak currents (A) measured for the present embodiment and the comparative example 4, in which the SRO films are formed to be 5 nm in film thickness.

TABLE 2

|  | Polarization inversion amount (at 1.1 V) | Leak current (at 1.1 V) |
| --- | --- | --- |
| Comparative example 1 | 7.9 $\mu C/cm^2$ | $9.45 \times 10^{-11}$ A |
| Comparative example 4 (SRO5 nm) | 16.1 $\mu C/cm^2$ | $4.85 \times 10^{-9}$ A |
| Present embodiment (SRO5 nm) | 17.9 $\mu C/cm^2$ | $8.38 \times 10^{-11}$ A |

In the comparative example 1, in which the SRO film is not formed, as presented in Table 1, the leak current is small but the polarization inversion amount is also small.

In the comparative example 2, in which the SRO film is formed but the second ferro-electric film is not formed, as presented in Table 1, the leak current is large and the polarization inversion amount is small.

In the comparative example 3, in which the first heat treatment is not performed and the second ferro-electric film is not formed, as presented in Table 1, the leak current is large and the polarization inversion amount is small.

In the comparative example 4, in which the heat treatment is performed every time after forming the first ferro-electric film, the second ferro-electric film, and the SRO film, as presented in Table 2, the polarization inversion amount is large but the leak current is increased by about one digit, compared with that of the comparative example 1.

In contrast, in the present embodiment, as presented in Tables 1, 2, the polarization inversion amount larger than that of the comparative example 4 can be obtained, and the leak current is as small as that of the comparative example 1.

In the present embodiment, the second ferro-electric film in an amorphous state is formed on the first ferro-electric film crystallized by the first heat treatment, and thereafter, the second heat treatment is performed collectively on the second ferro-electric film, the SRO film, and the first upper electrode film. The second heat treatment is performed when the second ferro-electric film is in an amorphous state. Thereby, grain boundaries in an interface between the second ferro-electric film and the SRO film, and in an interface between the SRO film and the first upper electrode film are expanded, so that Sr, Ru of the SRO film and Ir of the first upper electrode film become easy to be doped into the second ferro-electric film. By Sr, Ru, Ir doped into the second ferro-electric film, a matching property of a lattice interval of the second ferro-electric film to the first upper electrode film is made better, and a lattice strain of the second ferro-electric film is improved. Thereby, the large polarization inversion amount can be obtained.

Here, in the present embodiment, even when the grain boundaries are expanded as described above, the first ferro-electric film already crystallized exists under the second ferro-electric film. The capacitor film has a two-layer structure of the first and second ferro-electric films, so that an effective film thickness of the capacitor film is secured and excessive diffusion of Sr, Ru, and Ir is suppressed. Thereby, an increase of the leak current is restrained.

—Preferred Film Thickness of SRO Film in the Present Embodiment—

In the ferro-electric capacitor structure fabricated according to the present embodiment, based on the comparison with the ferro-electric capacitor structure without the SRO film fabricated according to the above-described comparative example 1, the polarization inversion amount and the leak current are measured. The ferro-electric capacitor structure according to the present embodiment is a ferro-electric capacitor structure fabricated by forming an SRO film each to be 1 nm, 2 nm, 3 nm, 4 nm, and 5 nm in film thickness.

Figure 14:
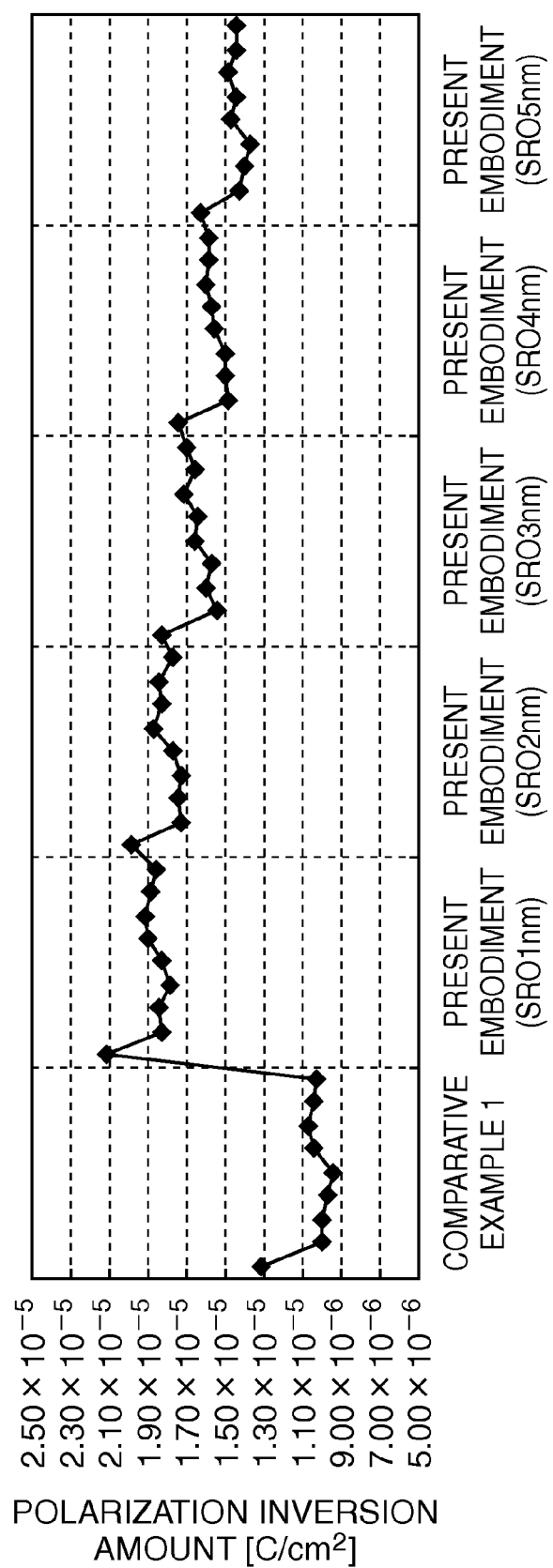
FIG. 14 is a characteristic chart illustrating measured results of polarization inversion amounts.
Figure 15:
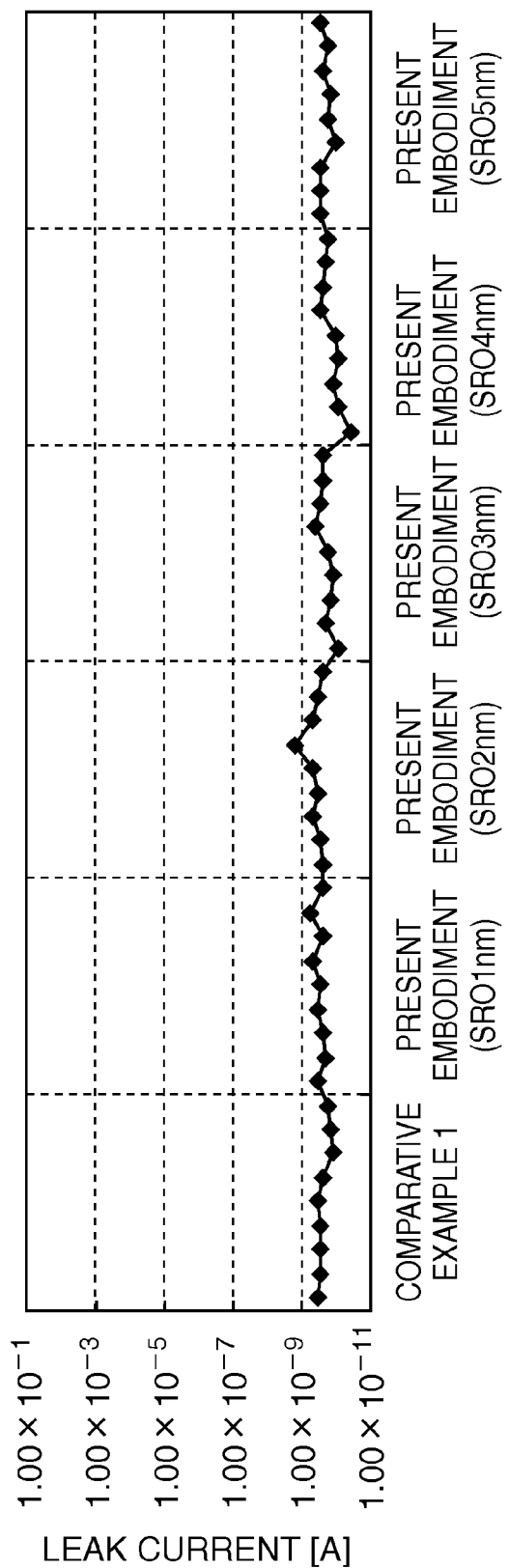
FIG. 15 is a characteristic chart illustrating measured results of leak currents.

Measured results of the polarization inversion amounts are presented in FIG. 14, and measured results of the leak currents are presented in FIG. 15, respectively. FIG. 14 and FIG. 15 each present the results of the comparative example 1 and the above-described 5 examples of the present embodiment which are each measured 9 times.

With regard to the polarization inversion amount, as presented in FIG. 14, a larger value can be obtained as a film thickness of the SRO film is smaller. It is understood that also in the ferro-electric capacitor structure in which the SRO film is film-formed to be 5 nm the polarization inversion amount larger than in the comparative example 1 in which the SRO film is not formed can be obtained.

With regard to the leak current, as presented in FIG. 15, in each ferro-electric capacitor structure according to the present embodiment, there is obtained a small amount approximately equal to that of each ferro-electric capacitor structure according to the comparative example 1.

In the SRO film, amounts of Sr, Ru, Ir doped into the second ferro-electric film are different depending on the film thickness thereof, and there occurs a difference in polarization inversion amount. If the SRO film is too thick, the amounts of Sr, Ru, and Ir doped into the second ferro-electric film become excessive and the polarization inversion amount becomes small. If the SRO film is too thin, the amounts of Sr, Ru, and Ir doped into the second ferro-electric film are insufficient, and the polarization inversion amount is not improved. Therefore, in the present embodiment, it is preferable that the SRO film is formed to be within a range of 1 nm to 5 nm in film thickness.

As described above, according to the present embodiment, even though a capacitor film 32 is being thinned, there is realized a planar-type FeRAM which includes a highly reliable ferro-electric capacitor structure 30 which secures a large polarization isolation amount while suppressing an increase of a leak current and which has a thin capacitor film 32.

Second Embodiment

In the present embodiment, there is exemplified what is called a stack-type FeRAM in which conduction of a lower electrode of a ferro-electric capacitor structure is secured in the lower of a ferro-electric capacitor structure and conduction of an upper electrode is secured in the upper of the ferro-electric capacitor structure, respectively. It should be noted that a structure of the FeRAM is described along with a method for manufacturing the same for convenience's sake of explanation.

FIG. 16A to FIG. 22B are schematic cross-sectional views illustrating a configuration of an FeRAM according to the second embodiment along with a method for manufacturing the same, in a sequence of process steps.

Figure 16A:
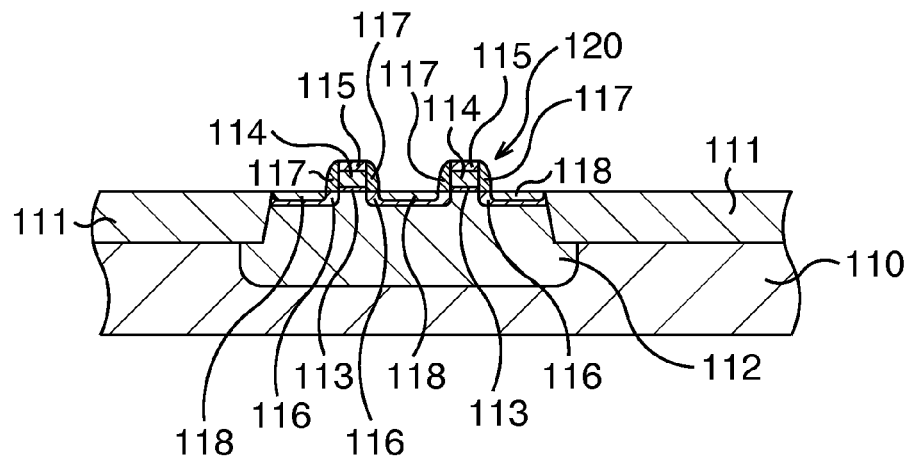
FIG. 16A to FIG. 16D are schematic cross-sectional views illustrating a method for manufacturing an FeRAM according to a second embodiment.

First, as illustrated in FIG. 16A, a MOS transistor 120 functioning as a selection transistor is formed on a silicon semiconductor substrate 110.

More specifically, an element isolation structure 111 is formed on a surface layer of the silicon semiconductor substrate 110 by a STI (Shallow Trench Isolation) method, for example. Thereby, an active region is defined on the semiconductor substrate 110.

An impurity, here, boron (B) being a p-type impurity, for example, is ion-implanted into the element active region under a condition of a doze amount of $3.0\times10^{13}/cm^2$ and an acceleration energy of 300 keV, for example. Thereby, a well 112 is formed.

A thin gate insulation film 113 of about 3.0 nm in film thickness is formed in the active region by thermal oxidation or the like. A polycrystalline silicon film of about 180 nm in film thickness and a silicon nitride film, for example, of 29 nm in film thickness are sequentially deposited on the gate insulation film 113 by a CVD method or the like. The silicon nitride film, the polycrystalline silicon film, and the gate insulation film 113 are processed into an electrode shape by lithography and subsequent dry-etching. Thereby, a gate electrode 114 is formed on the gate insulation film 113. On this occasion, simultaneously, a cap film 115 made of a silicon nitride film is formed on the gate electrode 114.

An impurity, here, arsenic (As) being an n-type impurity, for example, is ion-implanted into the element active region by using the cap film 115 as a mask, under a condition of a doze amount of $5.0\times10^{14}/cm^2$ and an acceleration energy of 10 keV, for example. Thereby, what is called an LDD region 116 is formed.

A silicon oxide film, for example, is deposited on an entire surface by a CVD method or the like, and an entire surface of the silicon oxide film is etch backed. Thereby, the silicon oxide film is left only on side surfaces of the gate electrode 114 and the cap film 115, whereby a sidewall insulation film 117 is formed.

An impurity, here, phosphor (P) being an n-type impurity, for example, is ion-implanted into the active region by using the cap film 115 and the sidewall insulation film 117 as a mask under a condition that an impurity density becomes higher than in the LDD region 116. Thereby, a source/drain region 118 overlapped on the LDD region 116 is formed, whereby the MOS transistor 120 is formed.

Figure 16B:
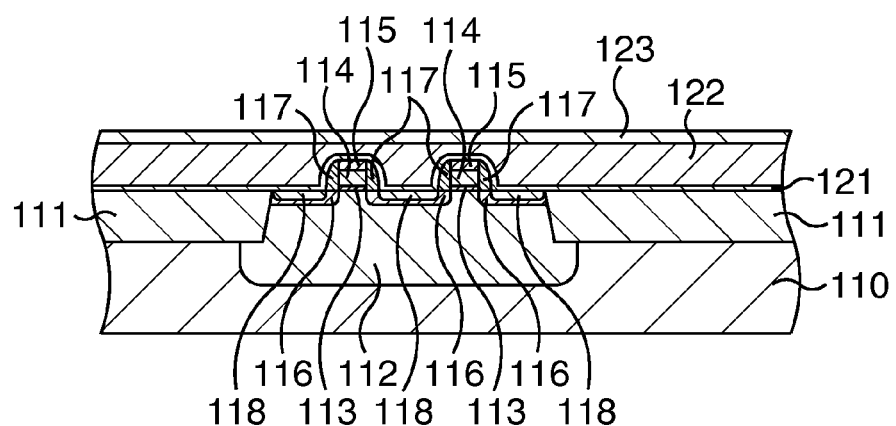

Subsequently, as illustrated in FIG. 16B, a protective film 121 of the MOS transistor 120, an interlayer insulation film 122 and an upper insulation film 123a are sequentially formed.

More specifically, the protective film 121, the interlayer insulation film 122, and the upper insulation film 123a are sequentially formed in a manner to cover the MOS transistor 120. Here, as the protective film 121, a silicon oxide film as a material is deposited to be about 20 nm in film thickness by a CVD method or the like. As the interlayer insulation film 122, first, there is formed a stacked structure made by sequentially film-forming a plasma SiO film (about 20 nm in thickness), a plasma SiN film (about 80 nm in film thickness), and a plasma TEOS film (about 1000 nm in film thickness), for example. After stacking, polishing is performed by CMP to achieve a film thickness of about 700 nm. Thereby, the interlayer insulation film 122 is formed. As the upper insulation film 123a, a silicon nitride film as a material is deposited to be about 100 nm in film thickness by a CVD method or the like.

Figure 16C:
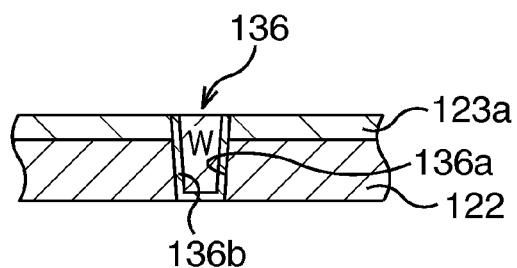

Subsequently, as illustrated in FIG. 16C, a conductive plug 136 to be connected to the source/drain region 118 of the MOS transistor 120 is formed. It should be noted that in each diagrams from FIG. 16C, only a configuration of a portion upper from the interlayer insulation film 122 is illustrated for convenience's sake of illustration, and illustration of the silicon semiconductor substrate 110, the MOS transistor 120 and so on is omitted.

More specifically, by using the source/drain region 118 as an etching stopper, the upper insulation film 123a, the interlayer insulation film 122, and the protective film 121 are processed by lithography and subsequent dry-etching until a part of a surface of the source/drain region is exposed. Thereby, a via hole 136a of about 0.3 µm in diameter, for example, is formed.

A Ti film and a TiN film, for example, are sequentially deposited to be about 20 nm in film thickness and to be about 50 nm in film thickness by a sputtering method or the like in a manner to cover a wall surface of the via hole 136a. Thereby, a base film (glue film) 136b is formed. A W film, for example, is formed by a CVD method or the like in a manner to fill the via hole 136a via the glue film 136b. Thereafter, the W film and the glue film 136b are polished by CMP by using the upper insulation film 123a as a stopper. Thereby, the conductive plug 136 to fill the inside of the via hole 136a with W via the glue film 136b is formed. After CMP, a plasma annealing treatment of $N_2O$, for example, is performed.

Figure 16D:
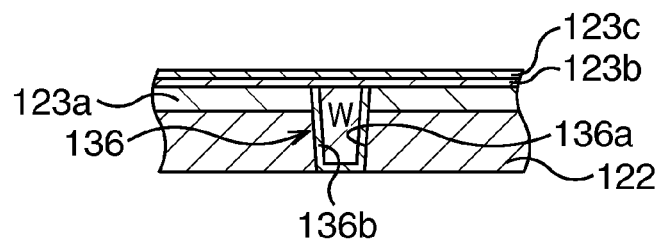

Subsequently, as illustrated in FIG. 16D, an orientation property improving film 123b and an oxygen barrier film 123c are sequentially formed.

More specifically, in order to improve an orientation property of the ferro-electric capacitor structure, after Ti, for example, is deposited to be about 20 nm in film thickness, Ti is nitrided to be TiN by a rapid thermal annealing (RTA) at 650° C. in an $N_2$ atmosphere. Thereby, the conductive orientation property improving film 123b is formed.

TiAlN, for example, is deposited to be about 100 nm in film thickness. Thereby, the conductive oxygen barrier film 123c is formed.

Figure 17A:
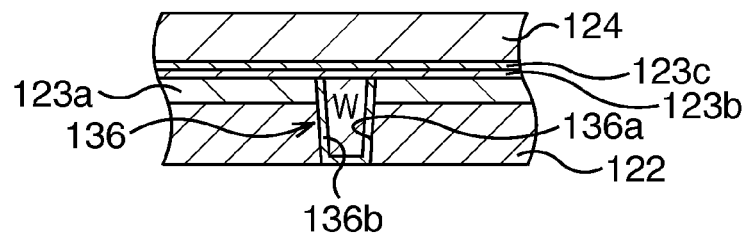
FIG. 17A to FIG. 17D are schematic cross-sectional views illustrating the method for manufacturing the FeRAM according to the second embodiment continued from FIG. 16D.

Subsequently, as illustrated in FIG. 17A, a lower electrode film 124 to be the lower electrode is formed.

More specifically, Pt is deposited by a sputtering method or the like thereby to form the lower electrode film 124. A concrete film-forming condition is that a Pt target is used, a charging power is 0.44 kW, Ar is supplied at a flow rate of 119 sccm as sputter gas, and film-forming is performed at a film-forming temperature of 350° C. for 180 seconds. Thereby, the lower electrode film 124 made of Pt of about 153 nm in film thickness is formed.

Figure 17B:
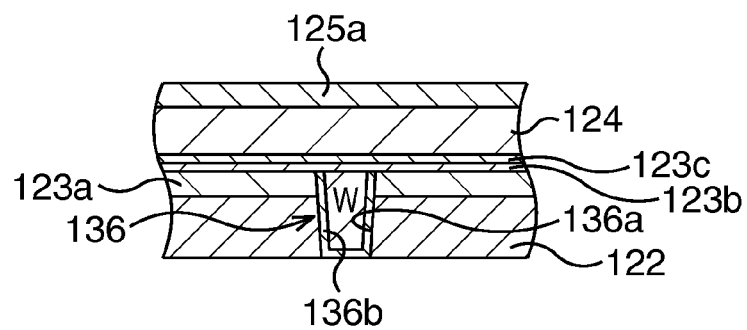

Subsequently, as illustrated in FIG. 17B, a first ferro-electric film 125a to be a lower layer of a capacitor film is formed.

More specifically, Pb $(Zr_x, Ti_{1-x})O_3$ (0<x<1) (PZT) is deposited to be about 50 nm to 120 nm in film thickness, for example, by a sputtering method or the like thereby to form the first ferro-electric film 125a. A concrete film-forming condition is that a PZT target is used, a charging power is 1 kW, Ar is supplied as a flow rate of 18 sccm as sputter gas, and film-forming is performed at a film-forming temperature of 50° C. for 112 seconds. Thereby, the first ferro-electric film 125a of about 70 nm in film thickness and made of PZT of 1.13 in Pb amount is formed on the lower electrode film 24. The first ferro-electric film 125a is formed in an amorphous state.

As a material of the first ferro-electric film 125a, there can be also used PZT or the like to which an element such as Ca, Sr, La, Nb, Ta, Ir, W, or Ru is added.

Figure 17C:
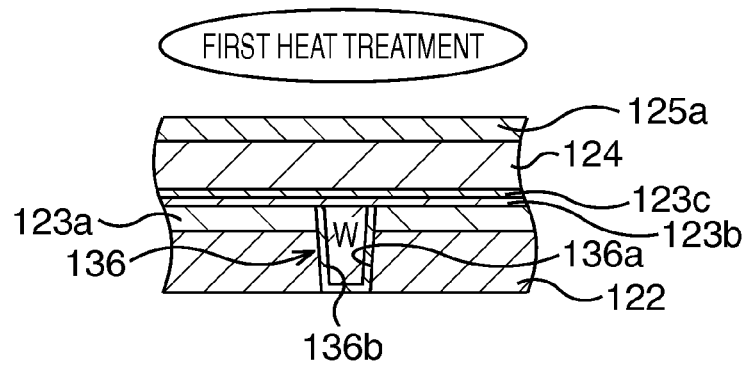

Subsequently, as illustrated in FIG. 17C, the semiconductor substrate 110 is subjected to a heat treatment (first heat treatment).

More specifically, as the first heat treatment, by using a predetermined rapid thermal annealing apparatus, the semiconductor substrate 110 is subjected to a rapid thermal annealing (RTA) treatment thereby to crystallize the first ferro-electric film 125a. A concrete heat treatment condition is that Ar is supplied at a flow rate of 1.975 slm and $O_2$ is supplied at a flow rate of 25 sccm as atmosphere gas, a treatment temperature is about 450° C. to 700° C., here, at 582° C., and a treatment time is for 20 seconds to 300 seconds, here, for 90 seconds. Thereby, the first ferro-electric film 125a which has been in the amorphous state at a beginning of film-forming is crystallized.

Figure 17D:
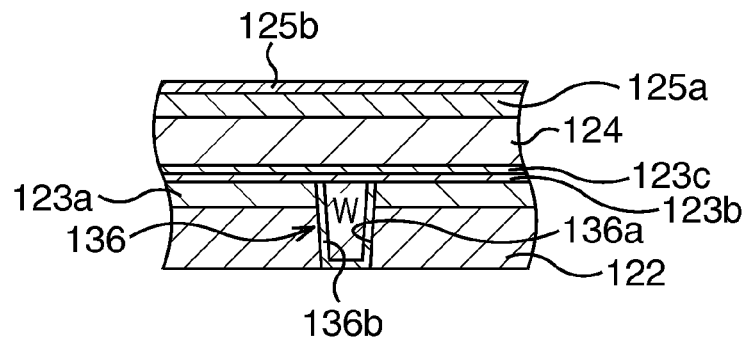

Subsequently, as illustrated in FIG. 17D, a second ferro-electric film 125b to be an upper layer of the capacitor film is formed.

More specifically, PZT is deposited to be thinner than the first ferro-electric film 125a, about 5 nm to 40 nm in film thickness, for example, by a sputtering method or the like thereby to form the second ferro-electric film 125b. A concrete film-forming condition is that a PZT target is used, a charging power is 1 kW, Ar is supplied at a flow rate of 18 sccm as sputter gas, and film-forming is performed at a film-forming temperature of 50° C. for 19 seconds. Thereby, the second ferro-electric film 125b of about 10 nm in film thickness and made of PZT of 1.13 in Pb amount is formed on the first ferro-electric film 125b. The second ferro-electric film 125b is formed in an amorphous state.

As a material of the second ferro-electric film 125b, there can be also used PZT or the like to which an element such as Ca, Sr, La, Nb, Ta, Ir, W, or Ru is added.

Figure 18A:
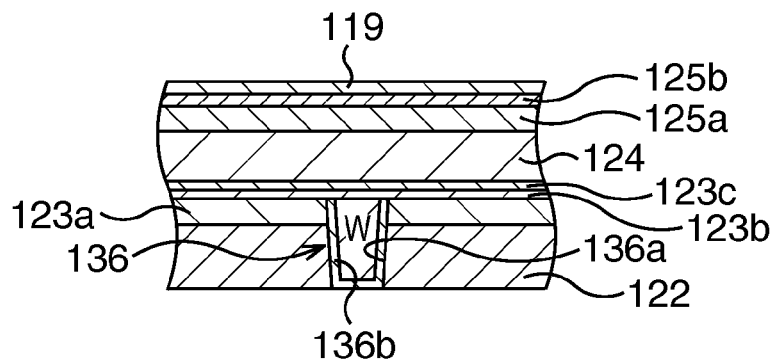
FIG. 18A to FIG. 18D are schematic cross-sectional views illustrating the method for manufacturing the FeRAM according to the second embodiment continued from FIG. 17D.

Subsequently, as illustrated in FIG. 18A, an $SrRuO_3$ (SRO) film 119 is formed.

More specifically, SRO is deposited to be about 1 nm to 5 nm in film thickness, for example, by a sputtering method or the like thereby to form the SRO film 119. A concrete film-forming condition is that an SRO target is used, a charging power is 0.31 kW, Ar is supplied at a flow rate of 100 sccm as sputter gas, and film-forming is performed at a film-forming temperature of 60° C. for 2 seconds. Thereby, the SRO film 119 of about 1 nm in film thickness is formed on the second ferro-electric film 125b. The SRO film 119 is formed in an amorphous state. Forming of the SRO film on a capacitor film of a ferro-electric enables a high polarization inversion amount in the capacitor structure even when the capacitor film is formed to be thin. Based on consideration described later, by forming the SRO film 119 to be about 1 nm to 5 nm in film thickness, it becomes possible to obtain a large polarization inversion amount.

Figure 18B:
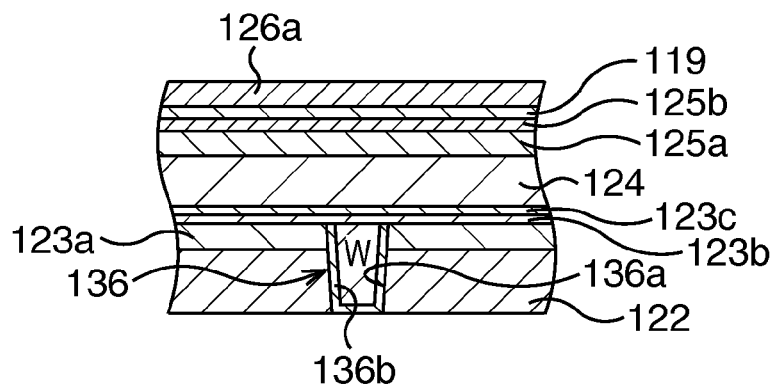

Subsequently, as illustrated in FIG. 18B, a first upper electrode film 126a to be a lower layer of the upper electrode is formed.

More specifically, $IrO_2$ is deposited to be about 10 nm to 200 nm in film thickness, for example, by a sputtering method or the like thereby to form the first upper electrode film 126a. A concrete film-forming condition is that an Ir target is used, a charging power is 1.91 kW, Ar is supplied at a flow rate of 100 sccm and $O_2$ is supplied at a flow rate of 52 sccm as sputter gas, and film-forming is performed at a film-forming temperature of 20° C. for 9 seconds. Thereby, the first upper electrode film 126a made of $IrO_2$ of about 49 nm in film thickness is formed on the SRO film 119.

As a material of the first upper electrode film 126a, there can be also used a conductive oxide or the like of Ir, Ru, $RuO_2$ or others instead of $IrO_2$.

Figure 18C:
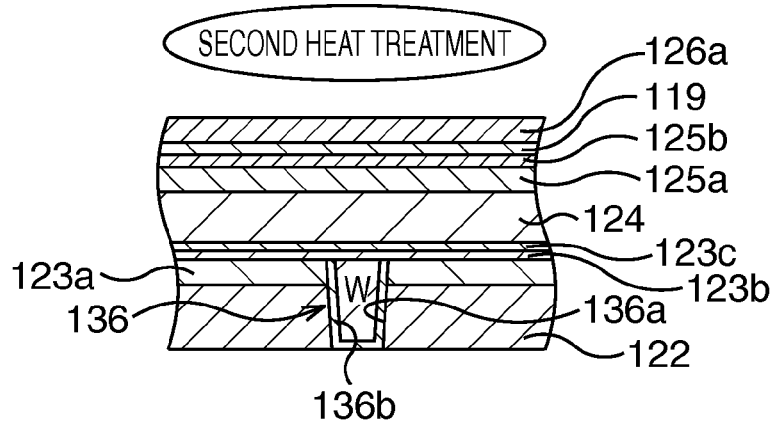

Subsequently, as illustrated in FIG. 18C, the semiconductor substrate 110 is subjected to a heat treatment (second heat treatment).

More specifically, as the second heat treatment, by using a predetermined rapid thermal annealing apparatus, the semiconductor substrate 110 is subjected to an RTA treatment thereby to crystallize the second ferro-electric film 125b and the SRO film 119. A concrete heat treatment condition is that Ar is supplied at a flow rate of 1.98 slm and $O_2$ is supplied at a flow rate of 20 sccm as atmosphere gas, a treatment temperature is about 550° C. to 800° C., here, 732° C., and a treatment time is for 30 seconds to 300 seconds, here, for 118 seconds. Thereby, the second ferro-electric film 125b and the SRO film 119 which have been in the amorphous states at a beginning of film-forming are crystallized.

Figure 18D:
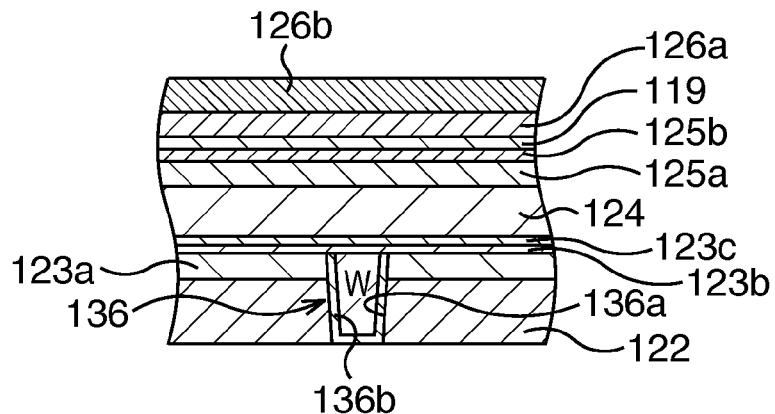

Subsequently, as illustrated in FIG. 18D, a second upper electrode film 126b to be an upper layer of the upper electrode is formed.

More specifically, $IrO_2$ is deposited to be about 25 nm to 250 nm in film thickness, for example, by a sputtering method or the like thereby to form the second upper electrode film 126b. A concrete film-forming condition is that an Ir target is used, a charging power is 1.03 kW, Ar is supplied at a flow rate of 100 sccm and $O_2$ is supplied at a flow rate of 90 sccm as sputter gas, and film-forming is performed at a film-forming temperature of 20° C. for 28 seconds. Subsequently, at a charging power of 2.03 kW and Ar being supplied at a flow rate of 100 sccm and $O_2$ being supplied at a flow rate of 90 sccm as sputter gas, film-forming is performed at a film-forming temperature of 20° C. for 4.4 seconds. Thereby, the second upper electrode film 126b made of $IrO_2$ of about 100 nm in film thickness is formed on the first upper electrode film 126a.

As a material of the second upper electrode film 126b, there can be also used a conductive oxide or the like of Ir, Ru, $RuO_2$ or others instead of $IrO_2$.

Figure 19A:
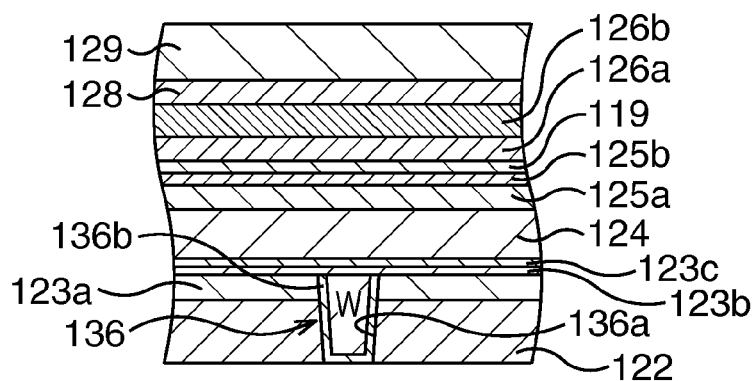
FIG. 19A to FIG. 19D are schematic cross-sectional views illustrating the method for manufacturing the FeRAM according to the second embodiment continued from FIG. 18D.

Subsequently, as illustrated in FIG. 19A, a TiN film 128 and a silicon oxide film 129 are formed.

More specifically, the TiN film 128 is deposited and formed to be about 200 nm in film thickness on the second upper electrode film 126b by a sputtering method or the like. The silicon oxide film 129 is stacked and formed to be about 1000 nm in film thickness on the TiN film 128 by a CVD method or the like using TEOS, for example. Here, an HDP film can be formed instead of the TEOS film. It should be noted that further forming a silicon nitride film on the silicon oxide film 129 is also preferable.

Figure 19B:
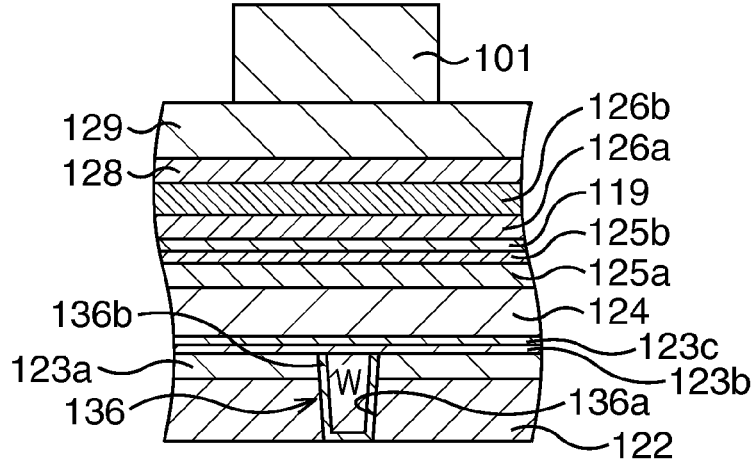

Subsequently, as illustrated in FIG. 19B, a resist mask 101 is formed.

More specifically, a resist is applied on the silicon oxide film 129, and the resist is processed into an electrode shape by lithography thereby to form the resist mask 101.

Figure 19C:
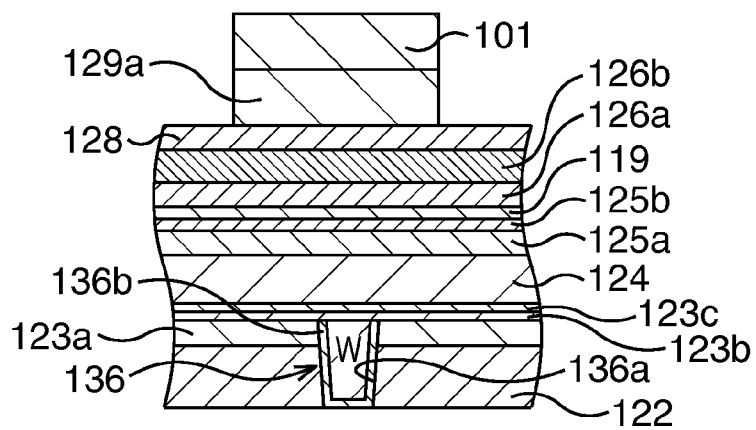

Subsequently, as illustrated in FIG. 19C, the silicon oxide film 129 is processed.

More specifically, by using the resist mask 101 as a mask, the silicon oxide film 129 is dry-etched. On this occasion, the silicon oxide film 129 is patterned copying an electrode shape of the resist mask 101, so that a hard mask 129a is formed. Further, the resist mask 101 is etched and its thickness is decreased.

Figure 19D:
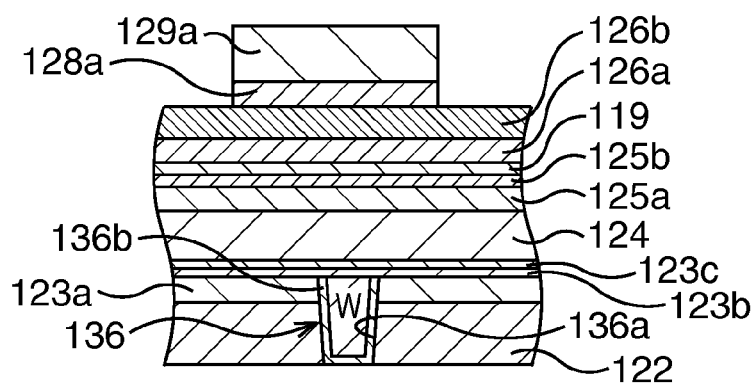

Subsequently, as illustrated in FIG. 19D, the TiN film 128 is processed.

More specifically, by using the resist mask 101 and the hard mask 129a as a mask, the TiN film 128 is dry-etched. On this occasion the TiN film 128 is patterned copying an electrode shape of the hard mask 129a, and a hard mask 128a is formed. Further, the resist mask 101 becomes thinner since the resist mask 101 itself is etched during the etching. Thereafter, the resist mask 101 is removed by an asking treatment or the like.

Figure 20A:
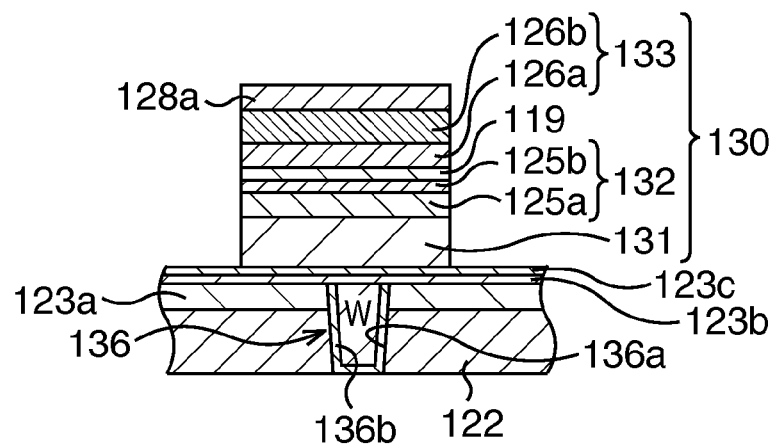
FIG. 20A to FIG. 20C are schematic cross-sectional views illustrating the method for manufacturing the FeRAM according to the second embodiment continued from FIG. 19D.

Subsequently, as illustrated in FIG. 20A, the second upper electrode film 126b, the first upper electrode film 126a, the SRO film 119, the second ferro-electric film 125b, the first ferro-electric film 125a, the lower electrode film 124, the oxygen barrier film 123c, and the orientation property improving film 123b are processed.

More specifically, the hard masks 128a, 129b are used as a mask and the upper insulation film 123a is used as an etching stopper. Then, the second upper electrode film 126b, the first upper electrode film 126a, the SRO film 119, the second ferro-electric film 125b, the first ferro-electric film 125a, the lower electric film 124, the oxygen barrier film 123c, and the orientation property improving film 123b are dry-etched. The second upper electrode film 126b, the first upper electrode film 126a, the SRO film 119, the second ferro-electric film 125b, the first ferro-electric film 125a, the lower electrode film 124, the oxygen barrier film 123c, and the orientation property improving film 123b are patterned copying the hard mask 128a. The hard mask 129a becomes thinner since the hard mask 129a itself is etched during the etching. Thereafter, the hard mask 129a is etch-removed by whole-surface dry-etching (etch back).

Figure 20B:
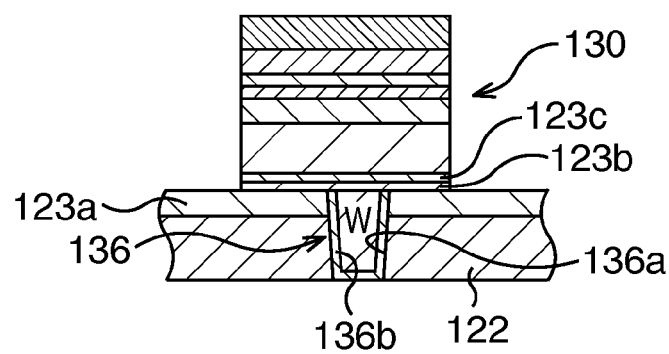

Subsequently, as illustrated in FIG. 20B, a ferro-electric capacitor structure 130 is formed.

More specifically, the hard mask 128a having been used as the mask is removed by wet-etching. On this occasion, the ferro-electric capacitor structure 130 in which the capacitor film 132, the SRO film 119, and the upper electrode 133 are sequentially stacked on the lower electrode 131 is formed. The lower electrode 131 is constituted by the lower electrode film 124. The capacitor film 132 is constituted by the crystallized first and second ferro-electric films 125a, 125b. The upper electrode 133 is constituted by the first and second upper electrode films 126a, 126b. In the ferro-electric capacitor structure 130, the lower electrode 131 is connected to the conductive plug 136 via the conductive orientation property improving film 123b and oxygen barrier film 123c. Then, a source/drain 118 and the lower electrode 131 are electrically connected via the conductive plug 136, the orientation property improving film 123b, and the oxygen barrier film 123c.

Figure 20C:
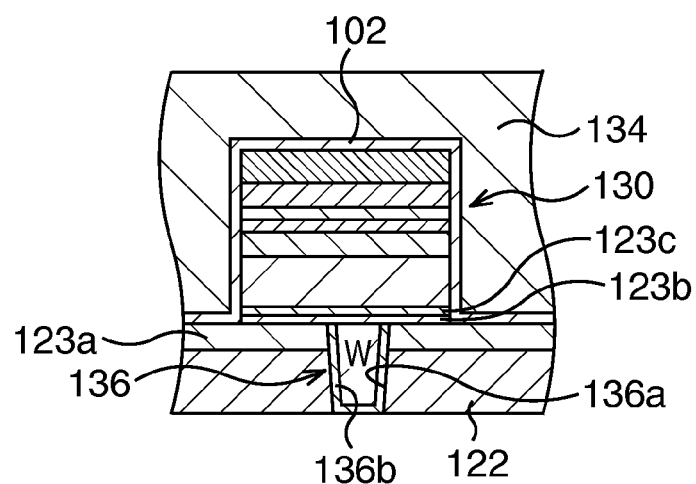

Subsequently, as illustrated in FIG. 20C, a protective film 102 and an interlayer insulation film 134 are formed. More specifically, alumina ($Al_2O_3$) as a material is deposited to be about 20 nm to 50 nm in film thickness by a sputtering method or the like in a manner to cover the ferro-electric capacitor structure 130. Thereby, the protective 102 is formed. Thereafter, the protective film 102 is subjected to an annealing treatment.

An interlayer insulation film 134 is formed in a manner to cover the ferro-electric capacitor structure 130 via the protective film 102. Here, the interlayer insulation film 134 is formed as a result that a silicon oxide film is deposited to be about 1500 nm to 2500 nm in film thickness by a plasma CVD method using TEOS, for example, or the like, and thereafter is polished to be about 1000 nm in film thicknes, for example, by CMP. After CMP, for the purpose of dehydration of the interlayer insulation film 134, a plasma annealing treatment of $N_2O$, for example, is performed.

Figure 21A:
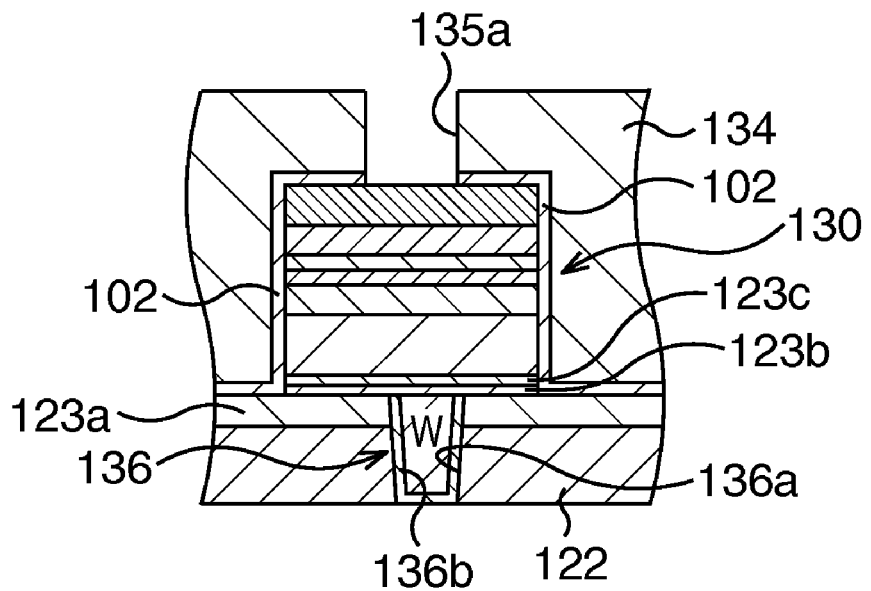
FIG. 21A and FIG. 21B are schematic cross-sectional views illustrating the method for manufacturing the FeRAM according to the second embodiment continued from FIG. 20C.

Subsequently, as illustrated in FIG. 21A, a via hole 135a to the upper electrode 132 of the ferro-electric capacitor structure 130 is formed.

More specifically, the interlayer insulation film 134 and the protective film 102 are patterned by lithography and subsequent dry-etching. Thereby, the via hole 135a which exposes a part of a surface of the upper electrode 133 is formed.

Figure 21B:
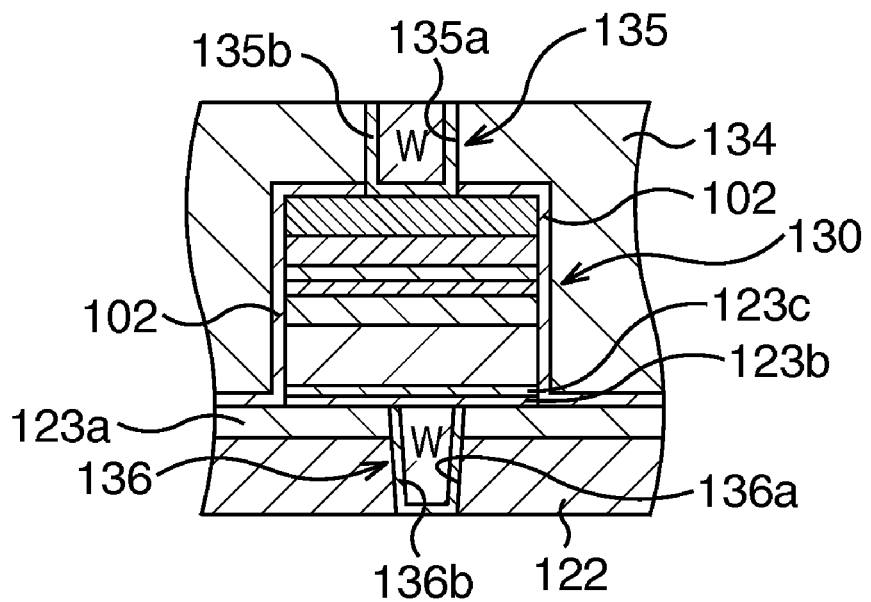

Subsequently, as illustrated in FIG. 21B, a conductive plug 135 to be connected to the upper electrode 132 of the ferro-electric capacitor structure 130 is formed.

More specifically, after a base film (glue film) 135b is formed in a manner to cover a wall surface of the via hole 135a, a W film is formed by a CVD method or the like in a manner to fill the via hole 135a via the glue film 135b. Then, by using the interlayer insulation film 134 as a stopper, the W film and the glue film 135b, for example, are polished by CMP. Thereby, the conductive plug 135 to fill the inside of the via hole 135a with W via the glue film 135b is formed. After CMP, a plasma annealing treatment of $N_2O$, for example, is performed.

Figure 22A:
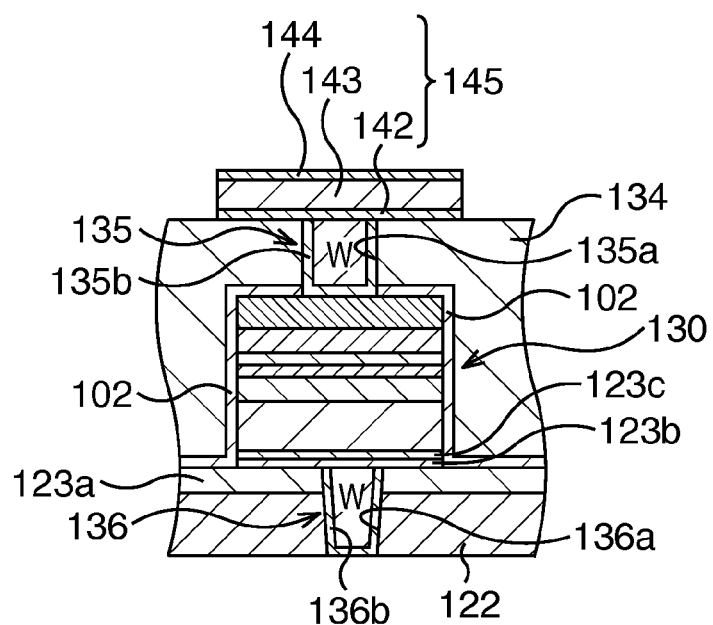
FIG. 22A and FIG. 22B are schematic cross-sectionals view illustrating the method for manufacturing the FeRAM according to the second embodiment continued from FIG. 21B.

Subsequently, as illustrated in FIG. 22A, a first wiring 145 each to be connected to the conductive plug 135 is formed.

More specifically, a barrier metal film 142, a wiring film 143, and a barrier metal film 144 are deposited on an entire surface of the interlayer insulation film 134 by a sputtering method or the like. As the barrier metal film 142, a Ti film is stacked and film-formed to be about 5 nm in film thickness and a TiN film is stacked and film-formed to be about 150 nm in film thickness, for example, by a sputtering method or the like. As the wiring film 143, an Al alloy film (here, Al—Cu film), for example, is film-formed to be about 350 nm in film thickness. As the barrier metal film 144, a Ti film is stacked and film-formed to be about 5 nm in film thickness and a TiN film is stacked and film-formed to be about 50 nm in film thickness, for example, by a sputtering method or the like. Here, since a structure of the wiring film 143 is the same as a structure of a logic part of other than an FeRAM of the same rule, there is no problem in a processing of the wiring and its reliability.

After an SiOn film or an antireflection film (not illustrated), for example, is film-formed as an antireflection film, the antireflection film, the barrier metal film 144, the wiring film 143, and the barrier metal film 142 are processed into a wiring shape by lithography and subsequent dry-etching. Thereby, the first wiring 145 to be connected to the conductive plug 135 is formed. It should be noted that instead of forming the Al alloy film as the wiring film 143, a Cu film (or a Cu alloy film) can be formed by using what is called a damascene method or the like thereby to form a Cu wiring as the first wiring 145.

Figure 22B:
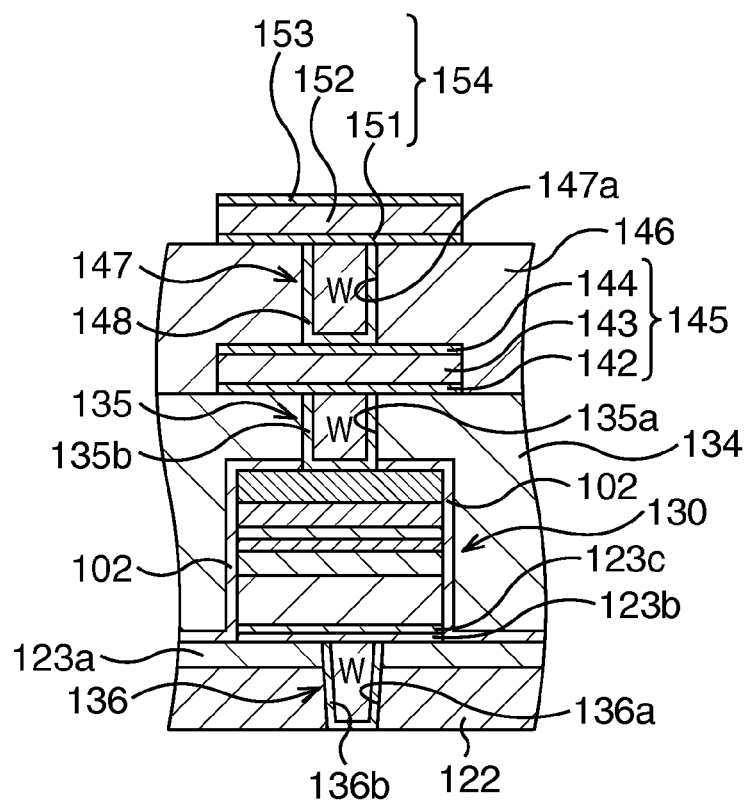

Subsequently, as illustrated in FIG. 22B, a second wiring 154 to be connected to the first wiring 145 is formed.

More specifically, an interlayer insulation film 146 is formed in a manner to cover the first wiring 145. As the interlayer insulation film 146, a silicon nitride film is film-formed to be about 700 nm in film thickness and a plasma TEOS film is formed to make an entire film thickness be about 1100 nm, and thereafter, a surface is polished by CMP thereby to form the film thickness to be about 750 nm.

Next, a conductive plug 147 to be connected to the first wiring 145 is formed.

The interlayer insulation film 146 is processed by lithography and subsequent dry-etching until a part of a surface of the first wiring 145 is exposed. Thereby, a via hole 147a of about 0.25 μmin diameter, for example, is formed. After a base film (glue film) 148 is formed in a manner to cover a wall surface of the via hole 147a, a W film is formed by a CVD method or the like in a manner to fill the via hole 147a via the glue film 148. Then, the W film and the glue film 148, for example, are polished by using the interlayer insulation film 146 as a stopper. Thereby, the conductive plug 147 to fill the inside of the via hole 147a with W via the glue film 148 is formed.

The second wiring 154 each to be connected to the conductive plug 147 is formed.

A barrier metal film 151, a wiring film 152, and a barrier metal film 153 are deposited on an entire surface by a sputtering method or the like. As the barrier metal film 151, a Ti film is stacked and film-formed to be about 5 nm in film thickness and a TiN film is stacked and film-formed to be about 150 nm in film thickness, for example, by a sputtering method or the like. As the wiring film 152, an Al alloy film (here, Al—Cu film) is film-formed to be about 350 nm in film thickness, for example. As the barrier metal film 153, a Ti film is stacked and film-formed to be about 5 nm in film thickness and a TiN film is stacked and film-formed to be about 150 nm in film thickness, for example, by a puttering method or the like. Here, since a structure of the wiring film 152 is the same as a structure of a logic part of other than an FeRAM of the same rule, there is no problem in a processing of wiring and its reliability.

After an SiON film or an antireflection film (not illustrated), for example, is film-formed as an antireflection film, the antireflection film, the barrier metal film 153, the wiring film 152, and the barrier metal film 151 are processed into a wiring shape by lithography and subsequent dry-etching. Thereby, the second wiring 154 is formed. It should be noted that instead of forming the Al alloy film as the wiring film 152, a Cu film (or a Cu alloy film) can be formed by using what is called a damascene method or the like thereby to form a Cu wiring as the second wiring 154.

Thereafter, after various process steps such as forming of an interlayer insulation film or a further upper layer wiring and so on, the stack-type FeRAM according to the present embodiment is formed.

As described above, according to the present embodiment, even though a capacitor film 132 is being thinned, there is realized a stack-type FeRAM which includes a highly reliable ferro-electric capacitor structure 130 which secures a large polarization isolation amount while suppressing an increase of a leak current and which has a thin capacitor film 132.

According to the above-described method for manufacturing a semiconductor device, even though a capacitor film is being thinned, there is realized a semiconductor device which includes a highly reliable capacitor structure which secures a large polarization isolation amount while suppressing an increase of a leak current and which has a thin capacitor film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A method for manufacturing a semiconductor device, comprising:

forming a first electrode film to be a lower electrode above a semiconductor substrate;

forming a first dielectric film on the first electrode film;

after forming the first dielectric film, performing a first heat treatment to the first dielectric film;

after performing the first heat treatment, forming a second dielectric film in an amorphous state on the first dielectric film;

forming an $SrRuO_3$ film on the second dielectric film in the amorphous state;

forming a second electrode film to be at least a part of an upper electrode on the $SrRuO_3$ film; and after forming the second electrode film, performing a second heat treatment to the $SrRuO_3$ film and the second dielectric film in the amorphous state to crystallize the second dielectric film.

2. The method for manufacturing the semiconductor device according to claim 1, wherein the $SrRuO_3$ film is formed to be equal to or more than 1 nm and equal to or less than 5 nm in film thickness.

3. The method for manufacturing the semiconductor device according to claim 1, wherein the first dielectric film and the second dielectric film are formed of ferro-electrics.

4. The method for manufacturing the semiconductor device according to claim 3, wherein the first dielectric film and the second dielectric film are formed of Pb $(Zr_x, Ti_{1-x})O_3$ $(0<x<1)$ or Pb $(Zr_x, Ti_{1-x})O_3$ to which an element is added.

5. The method for manufacturing the semiconductor device according to claim 1, wherein the second ferro-electric film is smaller than the first ferro-electric film in film thickness.

6. The method for manufacturing the semiconductor device according to claim 1, wherein the $SrRuO_3$ film is formed by a sputtering method.

7. The method for manufacturing the semiconductor device according to claim 1, wherein the second electrode film contains iridium.

8. The method for manufacturing the semiconductor device according to claim 1, wherein, in the second heat treatment, the $SrRuO_3$ film is crystallized.

* * * * *